(12) United States Patent
Mikawa et al.

(10) Patent No.: US 7,598,556 B2
(45) Date of Patent: Oct. 6, 2009

(54) FERROELECTRIC MEMORY DEVICE

(75) Inventors: Takumi Mikawa, Shiga (JP); Yuji Judai, Kyoto (JP)

(73) Assignee: Panasonic Corporation, Osaka (JP)

( * ) Notice: Subject to any disclaimer, the term of this patent is extended or adjusted under 35 U.S.C. 154(b) by 252 days.

(21) Appl. No.: 11/101,645

(22) Filed: Apr. 8, 2005

(65) Prior Publication Data

US 2005/0285170 A1    Dec. 29, 2005

(51) Int. Cl.
*G11C 11/22*    (2006.01)
(52) U.S. Cl. ................ 257/295; 257/298; 257/E29.164
(58) Field of Classification Search ................ 257/295, 257/E27.104, E29.164, 298, E21.664; 365/145
See application file for complete search history.

(56) References Cited

U.S. PATENT DOCUMENTS

| 5,567,636 | A | 10/1996 | Jones, Jr. | |
| 6,972,449 | B2 | 12/2005 | Yoshikawa et al. | |
| 2002/0045311 | A1* | 4/2002 | Mikawa | 438/240 |
| 2002/0066914 | A1* | 6/2002 | Imai et al. | 257/295 |
| 2003/0015743 | A1* | 1/2003 | Ogawa et al. | 257/296 |
| 2004/0094791 | A1* | 5/2004 | Ito et al. | 257/310 |

FOREIGN PATENT DOCUMENTS

| JP | 10-093045 | 4/1998 |
| JP | 11-008355 | 1/1999 |
| JP | 2000-150810 | 5/2000 |
| JP | 2001-044376 | 2/2001 |
| JP | 2002-083880 | 3/2002 |
| JP | 2002-198494 | 7/2002 |
| JP | 2003-174145 A | 6/2003 |
| JP | 2003-289134 A | 10/2003 |
| JP | 2003-332261 | 11/2003 |

OTHER PUBLICATIONS

Japanese Notice of Reasons for Rejection, w/ English translation thereof, issued in Japanese Patent Application No. JP 2006-034398 dated Jul. 14, 2009.

* cited by examiner

*Primary Examiner*—Anh Phung
*Assistant Examiner*—Michael Lulis
(74) *Attorney, Agent, or Firm*—McDermott Will & Emery LLP

(57) ABSTRACT

A semiconductor device includes: first and second conductive layers; a first insulating film; a first plug; a second insulating film; a first opening; and a capacitor constituted by a lower electrode made of a first metal film formed on the wall and bottom of the first opening and electrically connected to the upper end of the first plug, a capacitive dielectric film made of a ferroelectric film formed on the lower electrode, and an upper electrode made of a second metal film formed on the capacitive dielectric film. The second conductive layer and the upper electrode are electrically connected to each other in the first and second insulating films.

12 Claims, 24 Drawing Sheets

FERROELECTRIC MEMORY DEVICE

BACKGROUND OF THE INVENTION

The present invention relates to semiconductor devices and methods for fabricating the same with respect to a structure for drawing the potential of an upper electrode in a dielectric memory.

Ferroelectric memories having small capacities of 1 to 64 kbits using a planer or stacked structures have begun to be manufactured. In recent years, development of ferroelectric memories having three-dimensional stacked structures utilizing not only flat portions but also side portions of ferroelectric films has started. In a ferroelectric memory having a three-dimensional stacked structure, a contact plug electrically connected to a semiconductor substrate is placed immediately under a lower electrode so that a cell size is reduced and the integration degree is enhanced. In addition, a capacitive dielectric film is formed along a step so that the surface area of the capacitive dielectric film increases and a sufficient capacity is obtained. In this field, various cell structures of DRAMs have been proposed prior to ferroelectric memories.

First, a semiconductor device according to a first conventional example will be described with reference to FIG. 24 (see, for example, reference 1: Japanese Unexamined Patent Publication (Kokai) No. 2002-83880 (FIG. 1)).

FIG. 24 is a cross-sectional view illustrating a semiconductor device including a capacitor with a double-sided cylinder structure.

As shown in FIG. 24, isolation regions 11 are provided in a memory cell array region A1 and a peripheral region A2 of a silicon substrate 10. A gate insulating film 12 is formed on the silicon substrate 10. Gate electrodes 13 are formed on the gate insulating film 12. A doped layer (not shown) to be source/drain regions is selectively defined in a surface portion of the silicon substrate 10. In this manner, MOS transistors are formed. A first silicon nitride film 14 is formed over the silicon substrate 10 to cover the MOS transistors. A first interlayer insulating film 15 and a first silicon oxide film 16 are formed in this order over the first silicon nitride film 14. In a region which is not shown, interconnects 17 connected to drain regions of cell transistors are provided in the first interlayer insulating film 15 in the memory cell array region A1. Interconnects 17 connected to drain regions of the MOS transistors are provided in the peripheral region A2.

Contact plugs 18 connected to source regions of the MOS transistors are formed in the first silicon nitride film 14, the first interlayer insulating film 15 and the first silicon oxide film 16. A multilayer interlayer insulating film made of a second silicon nitride film 19, a second silicon oxide film 20 and a third silicon nitride film 21 is formed on the first silicon oxide film 16. Cylindrical holes 22 in which the first silicon oxide film 16 and the contact plugs 18 are exposed are formed in the multilayer interlayer insulating film. Each of the holes 22 is provided for an associated one of the contact plugs 18. A liner material 23 is provided on the inner wall and bottom of each of the holes 22.

In each of the holes 22, a lower electrode 24 that constitutes a double-sided cylinder capacitor in the shape of a cylinder and has a given thickness is formed on the bottom of the hole 22. The lower electrode 24 is electrically connected to an associated one of the contact plugs 18 via the liner material 23. Capacitive insulating films 25 are provided on the lower electrodes 24. Upper electrodes 26 are provided on the capacitive dielectric films 25. In this manner, double-sided cylinder stacked capacitors are formed.

A second interlayer insulating film 27 is formed on the upper electrodes 26. A contact hole 28 is formed through the second interlayer insulating film 27 to reach one of the upper electrodes 26. A metal interconnect layer 29 is provided so that the contact hole 28 is filled therewith. A third interlayer insulating film 30 is provided on the second interlayer insulating film 27. In this manner, a DRAM is formed.

In the three-dimensional structure of the DRAM described above, the potential of the upper electrode 26 is drawn from an upper portion via the contact plug directly connecting the upper electrode 26 to the interconnect 29.

Now, a semiconductor device according to a second conventional example will be described with reference to FIG. 25 (see, for example, reference 2: U.S. Pat. No. 5,567,636 (FIG. 15)).

FIG. 25 is a cross-sectional view illustrating a semiconductor device according to the second conventional example.

As shown in FIG. 25, isolation regions 51 and a doped layer 52 are formed in a silicon substrate 50. An interlayer insulating film 53 is provided over the silicon substrate 50, the isolation regions 51 and the doped layer 52. Contact plugs 54 are formed through the interlayer insulating film 53 connected at their lower ends to the doped layer 52. Lower electrodes 55 and ferroelectric films 56 are stacked in this order over the respective contact plugs 54. Sidewalls 58 for preventing short-circuits between the lower electrodes 55 and an upper electrode 57, which will be described later, are formed on the side surfaces of the lower electrodes 55 and the ferroelectric films 56. As shown in FIG. 25, an opening 59 is formed in one of the ferroelectric films 55 such that the upper surface of an associated one of the lower electrodes 55 is exposed in the opening 59. On the interlayer insulating film 53, an upper electrode 57 is formed to cover the lower electrodes 55, the ferroelectric films 56 and the sidewalls 58. In this manner, in the semiconductor device of the second conventional example shown in FIG. 25, the potential of the upper electrode 57 is not directly drawn to an upper portion but is drawn via the lower electrode 55.

However, as described for the first conventional example, when the structure in which the lower end of the contact plug from the interconnect is connected to the upper surface of the upper electrode is applied to a ferroelectric memory so as to draw the potentials of the upper electrode, the following problem arises.

That is, a ferroelectric film serving as a capacitive dielectric film constituting a ferroelectric memory is made of a metal oxide, typified by $SrBi_2Ta_2O_9$-based bismuth layer-structures or $PbZrO_3$-based perovskite crystal structures. These metal oxides are readily reduced when exposed to a reducing atmosphere, thus causing a problem of deterioration of properties of the ferroelectric film.

To prevent deterioration of properties of a ferroelectric film, a method using smaller amount of hydrogen in semiconductor processing conditions after formation of the ferroelectric film and a method of covering a ferroelectric capacitor with a hydrogen barrier film are generally adopted. In recent years, the latter method has been mainly adopted. This is because processes inevitably using hydrogen have appeared in semiconductor processing such as WCVD or recovery of Tr to meet increasing demand for miniaturization of semiconductor devices.

In the structure of the first conventional example in which ferroelectric capacitors are covered with a hydrogen barrier film, since the contact plug from the interconnect is connected to the upper electrode as described above, the contact plug has to be formed through a hydrogen barrier film provided over the upper electrode. Accordingly, entering of hydrogen into the ferroelectric films via the contact plug is unavoidable. Even if a hydrogen barrier material is used as a material with which the contact plug is filled, influences by hydrogen (e.g., $CH_3$ used for an etching gas) during formation of the contact hole cannot be avoided.

In the second conventional example, the structure in which a portion for drawing the potential of the upper electrode is connected to the doped layer via the opening of the ferroelectric film is disclosed. However, a problem arising when the ferroelectric memory has a three-dimensional stacked structure typified by a tapered structure is not taken into consideration.

Specifically, if the ferroelectric memory has a three-dimensional stacked structure, this structure makes the ferroelectric film formed along steps, so that the longitudinal distance between the upper electrode and lower electrodes or between the upper electrode and the storage node contact plugs is relatively large. Accordingly, problems such as deterioration of step coverage of the upper electrode deteriorates, difficulty in forming an opening having a high aspect ratio itself, and more difficulty in forming such an opening in a multilayer film arise. Therefore, if the ferroelectric memory has a three-dimensional stacked structure, it is difficult to achieve a structure in which the potential of the upper electrode is drawn to the doped layer via the opening of the ferroelectric film. In particular, with an advanced high-aspect-ratio structure that is a feature of a ferroelectric memory with a three-dimensional stacked structure, invention of a contact structure for a three-dimensional stacked structure in which a contact yield is taken into consideration becomes urgently imperative.

In the second conventional example, however, neither application of the structure in which the portion for drawing the potential of the upper electrode is connected to the doped layer via the opening in the ferroelectric film to a ferroelectric memory with a three-dimensional stacked structure nor application thereof to the structure in which the ferroelectric capacitor is covered with the hydrogen barrier film is disclosed.

SUMMARY OF THE INVENTION

It is therefore an object of the present invention to provide a dielectric memory having a three-dimensional stacked structure with a structure in which an upper electrode and a conductive layer are electrically connected to each other. It is another object of the present invention to provide a semiconductor device and a method for fabricating the same allowing for miniaturization and increase of a contact yield without peeling of the upper electrode.

In order to achieve the objects, according to an aspect of the present invention, a semiconductor device includes: first and second conductive layers spaced and formed in a semiconductor substrate; a first insulating film formed on the semiconductor substrate, the first conductive layer and the second conductive layer; a first plug formed through the first insulating film and having a lower end connected to the first conductive layer; a second insulating film formed on the first insulating film and having a first opening above the first plug; and a capacitor constituted by a lower electrode made of a first metal film formed on a wall surface and a bottom surface of the first opening and electrically connected to an upper end of the first plug, a capacitive dielectric film made of a ferroelectric film formed on the lower electrode, and an upper electrode made of a second metal film formed on the capacitive dielectric film, wherein the second conductive layer and the upper electrode are electrically connected to each other in the first and second insulating films.

In the semiconductor device according to the aspect of the present invention, the second conductive layer and the upper electrode are electrically connected to each other in the first and second insulating films. Accordingly, in a semiconductor memory device including a three-dimensional capacitor formed in a first opening, a structure for drawing the potential of an upper electrode is drawn to a conductive layer such as a doped layer formed under the capacitor is achieved.

Preferably, the semiconductor device according to the aspect of the present invention further includes a second plug formed through the first insulating film and having a lower end connected to the second conductive layer, wherein the second insulating film further has a second opening above the second plug, the second metal film extends from a portion on the capacitive dielectric film to cover a wall surface and a bottom surface of the second opening, and the second conductive layer and the upper electrode are electrically connected to each other via the second plug and a part of the second metal film electrically connected to the second plug and located on the wall and bottom surfaces of the second opening.

Then, the stacked contact structure of the second plug and the second metal film formed in the second opening allows electrical connection between the second conductive layer and the upper electrode. Accordingly, a structure in which decrease of a contact yield due to a high aspect ratio occurring when the upper electrode and the second conductive layer are directly connected to each other is implemented. In addition, the use of the second plug formed simultaneously with the first plug serving as a storage node contact plug eliminates the necessity of forming an additional contact plug above the upper electrode, thus preventing the number of fabrication process steps from increasing.

Preferably, the semiconductor device according to the aspect of the present invention further includes a second plug formed through the first insulating film and having a lower end connected to the second conductive layer, wherein the second insulating film further has a second opening above the second plug, the ferroelectric film extends from a portion on the lower electrode to cover an upper surface of the second insulating film such that the ferroelectric film has a third opening continuous to the second opening, the second metal film extends from a portion on the capacitive dielectric film to cover a wall surface and a bottom surface of the second opening, and the second conductive layer and the upper electrode are electrically connected to each other via the second plug and a part of the second metal film electrically connected to the second plug and located on the wall and bottom surfaces of the second opening.

Then, since the third opening continuous to the second opening is provided, the aperture sizes of the second and third openings are appropriately set with consideration of, for example, the degree of miniaturization and patterning of a material whose miniaturization is difficult, so that the semiconductor device is miniaturized with a high flexibility in design.

In the semiconductor device according to the aspect of the present invention, the second opening preferably has an aperture size smaller than that of the third opening.

Then, the aperture size of the third opening of the ferroelectric film made of, for example, a metal oxide whose miniaturization is difficult is large and the aperture size of the second opening of the second insulating film whose miniaturization is easy is small, so that the second opening is smaller than the first opening. Accordingly, further miniaturization of the semiconductor device is achieved.

In the semiconductor device according to the aspect of the present invention, the second opening and the third opening preferably have an identical aperture size.

Then, alignment margins and the like are unnecessary, so that the semiconductor device is further miniaturized.

The semiconductor device according to the aspect of the present invention further includes a second plug formed through the first insulating film and having a lower end connected to the second conductive layer, wherein the second insulating film further has a second opening above the second plug, the first metal film is also formed on a wall surface and a bottom surface of the second opening, the second metal film extends from a portion on the capacitive dielectric film to cover the part of the first metal film located on the wall and bottom surfaces of the second opening, and the second conductive layer and the upper electrode are electrically connected to each other via the second plug, the first metal film electrically connected to the second plug and located on the wall and bottom surfaces of the second opening, and the second metal film located on the first metal film.

Then, the first metal film and the second metal film are stacked and no capacitive dielectric film is provided in the second opening, so that even during heat treatment for crystallization of a ferroelectric, for example, the first metal film and the second metal film are tightly in contact with each other and no peeling occurs. Accordingly, no disconnection occurs in the first metal film and a structure in which decrease of a contact yield is suppressed is achieved.

Preferably, the semiconductor device according to the aspect of the present invention further includes a second plug formed through the first insulating film and having a lower end connected to the second conductive layer, wherein the second insulating film further has a second opening above the second plug, the first metal film is also formed on a wall surface and a bottom surface of the second opening, the ferroelectric film is also formed on the part of the first metal film located on the wall and bottom surfaces of the second opening, the second metal film extends from a portion on the capacitive dielectric film to cover the parts of the first metal film and the ferroelectric film located on the wall and bottom surfaces of the second opening and is in contact with at least a part of the first metal film, the second conductive layer and the upper electrode are electrically connected to each other via the second plug, the first metal film electrically connected to the second plug and located on the wall and bottom surfaces of the second opening, and the second metal film in contact with the part of the first metal film.

The structure in the second opening is the same as that of the capacitor formed in the first opening, so that the potential of the upper electrode is easily drawn to the second doped layer, as compared to a case where a specific structure different from that in the first opening is provided in the second opening so as to draw the potential of the upper electrode to the second conductive layer. If some type of a material is selected for the second metal film, peeling of the second metal film from the second insulating film is prevented.

In the semiconductor device according to the aspect of the present invention, an oxygen barrier film is preferably formed between the first plug and the lower electrode.

Then, oxidation of the first plug is prevented during heat treatment performed in an oxygen atmosphere necessary for crystallization of a ferroelectric.

In the semiconductor device according to the aspect of the present invention, the first metal film is preferably made of a metal oxide.

If a general noble metal material such as platinum is used for the second metal film, the second metal film is readily peeled off from an oxide film or the like. On the other hand, if a metal oxide is used for the second metal film, the possibility of peeling of the second metal film is eliminated, so that limitation of the structure for drawing the potential of the upper electrode to the second conductive layer is reduced.

In the semiconductor device according to the aspect of the present invention, the capacitor is preferably covered with a hydrogen barrier film.

Then, reduction by hydrogen is prevented, so that deterioration of ferroelectric properties is also prevented.

To achieve the objects described above, according to an aspect of the present invention, a first method for fabricating a semiconductor device includes the steps of: forming first and second conductive layers with a spacing in a semiconductor substrate; forming a first insulating film on the semiconductor substrate, the first conductive layer and the second conductive layer; forming a first plug and a second plug through the first insulating film such that the first plug has a lower end connected to the first conductive layer and the second plug has a lower end connected to the second conductive layer; forming a second insulating film on the first insulating film; forming a first opening in the second insulating film above the first plug; forming a first metal film on a wall surface and a bottom surface of the first opening; forming a ferroelectric film on the second insulating film and the first metal film; forming a second opening in the second insulating film and the ferroelectric film above the second plug; and forming a second metal film on the ferroelectric film and a wall surface and a bottom surface of the second opening such that the second metal film is electrically connected to the second plug.

With the first method for fabricating a semiconductor device according to the aspect of the present invention, the second conductive layer and the second metal film serving as the upper electrode are electrically connected to each other by using a stacked contact structure of the second plug and the second metal film formed in the second opening, so that a structure for drawing the potential of the upper electrode to the second conductive layer such as a doped layer is achieved. In this case, decrease of a contact yield due to a high aspect ratio occurring when the second metal film and the second conductive layer are directly connected to each other is suppressed. In addition, the use of the second plug capable of being formed simultaneously with the first plug serving as a storage node contact plug prevents the number of process steps from increasing. Furthermore, the first opening constituting the capacitor and a second opening are not formed at the same time, so that the second opening as a contact portion between the second conductive layer and the upper electrode is small, thus achieving miniaturization.

To achieve the objects described above, according to another aspect of the present invention, a second method for fabricating a semiconductor device includes the steps of: forming first and second conductive layers with a spacing in a semiconductor substrate; forming a first insulating film on the semiconductor substrate, the first conductive layer and the second conductive layer; forming a first plug and a second plug through the first insulating film such that the first plug has a lower end connected to the first conductive layer and the second plug has a lower end connected to the second conductive layer; forming a second insulating film on the first insulating film; forming a first opening in the second insulating film above the first plug; forming a first metal film on a wall surface and a bottom surface of the first opening; forming a ferroelectric film on the second insulating film and the first metal film; patterning the ferroelectric film such that a part of the second insulating film located above the second plug is exposed; forming a second opening in the exposed part of the second insulating film; and forming a second metal film on the ferroelectric film and on at least a wall surface and a bottom surface of the second opening such that the second metal film is electrically connected to the second plug.

With the second method for fabricating a semiconductor device according to the aspect of the present invention, the second conductive layer and the second metal film serving as the upper electrode are electrically connected to each other by using a stacked contact structure of the second plug and the second metal film formed in the second opening, so that a structure for drawing the potential of the upper electrode to the second conductive layer such as a doped layer is achieved. In this case, decrease of a contact yield due to a high aspect ratio occurring when the second metal film and the second conductive layer are directly connected to each other is suppressed. In addition, the use of the second plug capable of being formed simultaneously with the first plug serving as a storage node contact plug prevents the number of process steps from increasing. Furthermore, the second insulating film is exposed by patterning the ferroelectric film made of, for example, a metal oxide whose miniaturization is difficult before the second opening is formed. Accordingly, processing for miniaturization of the second opening is easy, so that the semiconductor device is further miniaturized.

To achieve the objects described above, according to still another aspect of the present invention, a third method for fabricating a semiconductor device includes the steps of: forming first and second conductive layers with a spacing in a semiconductor substrate; forming a first insulating film on the semiconductor substrate, the first conductive layer and the second conductive layer; forming a first plug and a second plug through the first insulating film such that the first plug has a lower end connected to the first conductive layer and the second plug has a lower end connected to the second conductive layer; forming a second insulating film on the first insulating film; forming a first opening in the second insulating film above the first plug and forming a second opening in the second insulating film above the second plug; forming a first metal film on a wall surface and a bottom surface of the first opening and on a wall surface and a bottom surface of the second opening; forming a ferroelectric film on the second insulating film and the first metal film; patterning the ferroelectric film such that at least a part of the first metal film formed on the wall and bottom surfaces of the second opening is exposed; and forming a second metal film covering the ferroelectric film and being in contact with the part of the first metal film.

With the third method for fabricating a semiconductor device according to the aspect of the present invention, the second conductive layer and the second metal film serving as the upper electrode are electrically connected to each other by using a stacked contact structure of the second plug, the first metal film formed in the second opening and the second metal film in contact with a part of the first metal film, so that a structure for drawing the potential of the upper electrode to the second conductive layer such as a doped layer is achieved. In this case, decrease of a contact yield due to a high aspect ratio occurring when the second metal film and the second conductive layer are directly connected to each other is suppressed. In addition, the use of the second plug capable of being formed simultaneously with the first plug serving as a storage node contact plug prevents the number of process steps from increasing. Furthermore, the structure in the second opening is the same as that of the capacitor formed in the first opening, so that the potential of the upper electrode is easily drawn to the second conductive layer, as compared to a case where a specific structure different from that in the first opening is provided in the second opening so as to draw the potential of the upper electrode to the second conductive layer. If some type of a material is selected for the second metal film, peeling of the second metal film from the second insulating film is prevented.

Preferably, in the first through third methods according to the aspects of the present invention, a first oxygen barrier film is formed between an upper end of the first plug and the bottom surface of the first opening, and a second oxygen barrier film is formed between an upper end of the second plug and the bottom surface of the second opening.

Then, oxidation of the first plug and the second plug is prevented during heat treatment performed in an oxygen atmosphere necessary for crystallization for a ferroelectric.

Preferably, in the first through third methods according to the aspects of the present invention, a first hydrogen barrier film is preferably formed under the first opening, and a second hydrogen barrier film is formed on an upper surface of the second metal film.

Then, deterioration of ferroelectric properties is prevented.

As described above, in a semiconductor device and a method according to an aspect of the present invention, the second conductive layer and the upper electrode are electrically connected to each other via the insides of the first and second insulating films. Accordingly, in a semiconductor memory device including a three-dimensional capacitor formed in the first opening, a structure for drawing the potential of the upper electrode to a conductive layer such as a doped layer is implemented.

DESCRIPTION OF THE PREFERRED EMBODIMENTS

Hereinafter, embodiments of the present invention will be described with reference to the drawings.

Embodiment 1

Hereinafter, a semiconductor device according to a first embodiment of the present invention will be described with reference to FIGS. 1 through 7.

Figure 1:
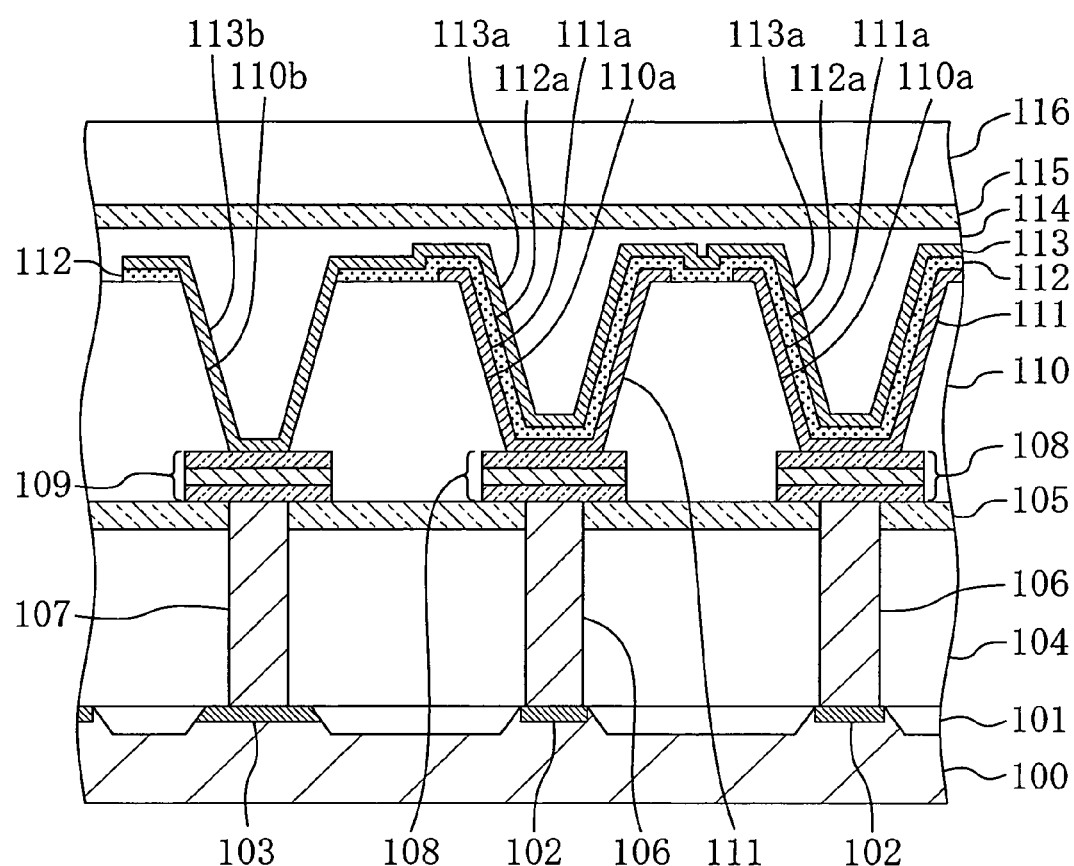
FIG. 1 is a cross-sectional view illustrating a main portion of a structure of a semiconductor device according to a first embodiment of the present invention.

FIG. 1 is a cross-sectional view illustrating a semiconductor device according to the first embodiment.

As shown in FIG. 1, isolation regions (STI) 101 for defining transistor regions are formed in a semiconductor substrate 100. A first doped layer (first conductive layer) 102 and a second doped layer (second conductive layer) 103 are provided in the transistor regions defined by the isolation regions 101. A cobalt silicide ($CoSi_2$) may be formed on the surfaces of the first doped layer 102 and the second doped layer 103. In such a case, resistance is farther reduced, and delay in circuit operation is prevented. In FIG. 1, the second conductive layer is the second doped layer 103 defined in the semiconductor substrate 100. Alternatively, a conductive layer included in a first insulating film 104, which will be described later, e.g., an interconnect using polysilicon or tungsten, may be used, for example.

A first insulating film 104 of a $SiO_2$ film with a thickness of 500 to 800 nm, for example, is formed to cover the semiconductor substrate 100, the isolation regions 101, the first doped layer 102 and the second doped layer 103. A first hydrogen barrier film 105 of a SiN film with a thickness of 20 to 100 nm, for example, is formed on the first insulating film 104. FIG. 1 shows the structure including the first hydrogen barrier film 105. Alternatively, the first hydrogen barrier film 105 may be omitted, if not necessary.

First contact plugs (first plugs) 106 are formed through the first insulating film 104 and the first hydrogen barrier film 105 connected at their lower ends to the first doped layer 102. A second contact plug (second plug) 107 is formed through the first insulating film 104 and the first hydrogen barrier film 105 connected at its lower end to the second doped layer 103. The first contact plugs 106 and the second contact plug 107 are made of tungsten or polysilicon. The first contact plugs 106 and the second contact plug 107 may include a barrier film made of TiN and Ta.

Conductive first oxygen barrier films 108 and a conductive second oxygen barrier film 109 as a stack of $IrO_2$/Ir/TiAlN, for example, are formed on the first hydrogen barrier film 105 to cover the upper surfaces of the first contact plugs 106 and the second contact plug 107, respectively. The first oxygen barrier films 108 and the second oxygen barrier film 109 prevent oxidation of the first contact plugs 106 and the second contact plug 107 during heat treatment performed in an oxygen atmosphere for crystallization of a ferroelectric film 112, which will be described later. The first oxygen barrier films 108 and the second oxygen barrier film 109 may be omitted as long as the ferroelectric film 112 is crystallized at a sufficiently low temperature. TiAlN as the lowermost layer constituting the first oxygen barrier films 108 and the second oxygen barrier film 109 also functions as a hydrogen barrier film.

A second insulating film 110 of a $SiO_2$ film with a thickness of 700 to 1000 nm, for example, is formed on the first hydrogen barrier film 105 to cover the first oxygen barrier films 108 and the second oxygen barrier film 109. The second insulating film 110 has first openings 110a in which the upper surfaces of the first oxygen barrier films 108 are exposed and a second opening 110b in which the upper surface of the second oxygen barrier film 109 is exposed. Each of the first openings 110a and the second opening 110b has a tapered shape and has an aperture size that increases toward the top thereof, as shown in FIG. 1.

The first openings 110a, the first oxygen barrier films 108, the first contact plugs is 106 and others are used to form capacitances of ferroelectric memories. Although not shown, a plurality of structures having the same shape are formed to the right of the drawing. The second opening 110b is formed to draw the potential of an upper electrode, which will be described later, to the second doped layer 103. Therefore, one second opening 110b is sufficient for a plurality of ferroelectric memories described above (e.g., cell plates of memory cells).

First metal films 111 in the shape of cylinders made of a noble metal typified by platinum or iridium or a metal oxide containing such a metal and having third openings 110a are formed on the walls and bottoms of the first openings 110a and the second insulating film 110. As shown in the drawing, the ends of each of the first metal films 111 are located on the surface of the second insulating film 110 and extend outward across the edge of an associated one of the first openings 110a. This structure is formed to secure an alignment margin used in forming the first metal films 111 in the first openings 110a by patterning. The first metal films 111 serve as lower electrodes.

A ferroelectric film 112 made of a SBT-based, PZT-based or BLT-based material, for example, and having fourth openings 112a is formed on portions of the second insulating film 110 except for the wall and bottom of the second opening 110b and also on the walls and bottoms of the third openings 110a of the first metal films 111. The ferroelectric film 112 serves as a capacitive dielectric film. A second metal film 113 made of a noble metal typified by platinum or iridium or a metal oxide containing such a metal and having fifth openings 113a and a sixth opening 113b is formed on the ferroelectric film 112 including the walls and bottoms of the fourth openings 112a and on the wall and bottom of the second opening 110b. The second metal film 113 serves as an upper electrode. If compatibility with the ferroelectric film in terms of, for example, crystal junction face, orientation or influence of a layer containing an impurity, is maintained even with the use of a metal oxide such as iridium oxide for the second metal film 113, the second metal film 113 is in tight contact with the second insulating film 110 typified by a SiO$_2$ film. Therefore, this structure has an advantage in which a contact yield is stabilized.

A third insulating film 114 with a thickness of 50 to 300 nm, for example, is formed on the second metal film 113 including the fifth openings 113a and the sixth opening 113b. A second hydrogen barrier film 115 is formed on the third insulating film 114. If the ferroelectric film 112 made of a ferroelectric material having reduction resistance is used, the first hydrogen barrier film 105 and the second hydrogen barrier film 115 may be omitted. However, in general, a combination of hydrogen barrier films is used to connect the first hydrogen barrier film 105 and the second hydrogen barrier film 112 to each other at an end of a memory cell, for example, so that a region including the portion for drawing the potential of the upper electrode to the second doped layer 103 is completely covered with the hydrogen barrier films. This ensures prevention of characteristic deterioration of ferroelectric capacitors caused by hydrogen.

A fourth insulating film 116 with a thickness of 100 to 300 nm, for example, is formed on the second hydrogen barrier film 115. Though not shown, general interconnects and others are formed on the fourth insulating film 115.

As described above, in the semiconductor device of the first embodiment, ferroelectric capacitors constituted by lower electrodes made of the first metal films 111, the capacitive dielectric film made of the ferroelectric film 112 and the upper electrode lo made of the second metal film 113 are formed in at least the second openings 110a. The second metal film 113 extends from portions of the ferroelectric film 112 located on the walls and bottoms of the fourth openings 112a to the wall and bottom of the second opening 110b, so that the upper electrode and the second doped layer 103 are electrically connected to each other via the second oxygen barrier film 109 and the second contact plug 107 formed under the bottom of the second opening 110b. In this manner, the potential of the upper electrode is electrically connected to the second doped layer 103 in the first and second interlayer insulating films 104 and 110. This suppresses decrease of a contact yield due to a high aspect ratio occurring when the upper electrode and the second doped layer 103 are directly connected to each other. In addition, the use of the second contact plug 107 formed simultaneously with the first contact plugs 106 serving as storage node contact plugs prevents the number of fabrication process steps of a semiconductor fabrication device from increasing.

Hereinafter, modified examples of the first embodiment will be described.

FIRST MODIFIED EXAMPLE

Figure 2:
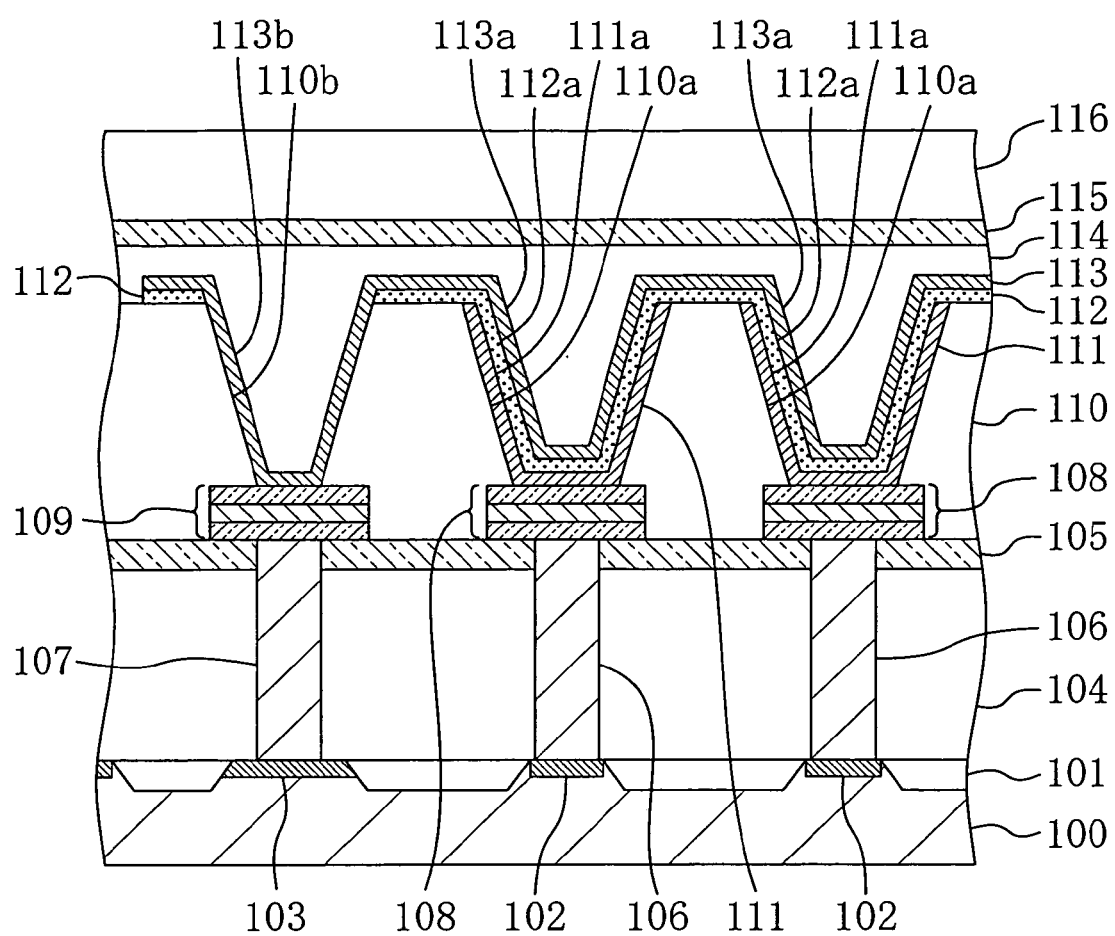
FIG. 2 is a cross-sectional view illustrating a main portion of a structure of a semiconductor device according to a first modified example of the first embodiment.

FIG. 2 is a cross-sectional view illustrating a semiconductor device according to a first modified example of the first embodiment. In FIG. 2, components corresponding to those of the semiconductor device shown in FIG. 1 are denoted by the same reference numerals.

As shown in FIG. 2, the semiconductor device of the first modified example is different from the semiconductor device shown in FIG. 1 in that the first metal films 111 are formed only on the walls and bottoms of the first openings 110a. This structure is achieved by depositing a first metal film 111 over the entire surface of the second insulating film 110 including the walls and bottoms of the first openings 110a and then performing CMP or an etch-back process thereon such that the first metal film 111 remains only on the walls and bottoms of the first openings 110a in a self-aligned manner.

In the semiconductor device of the first modified example, the first metal films 111 are formed only on the walls and bottoms of the first openings 110a in a self-aligned manner, so that no steps are formed at the ends of the first metal films 111, which extend outward across the edges of the first openings 110a in the semiconductor device shown in FIG. 1. Accordingly, the thickness of the resist does not vary, and thus the accuracy in patterning the second opening 110b is enhanced. In addition, alignment margins between the first metal films 111 and the first openings 110a are unnecessary, so that the cell size is reduced and a miniaturized semiconductor device is achieved.

SECOND MODIFIED EXAMPLE

Hereinafter, a semiconductor device according to a second modified example of the first embodiment will be described with reference to FIG. 3.

Figure 3:
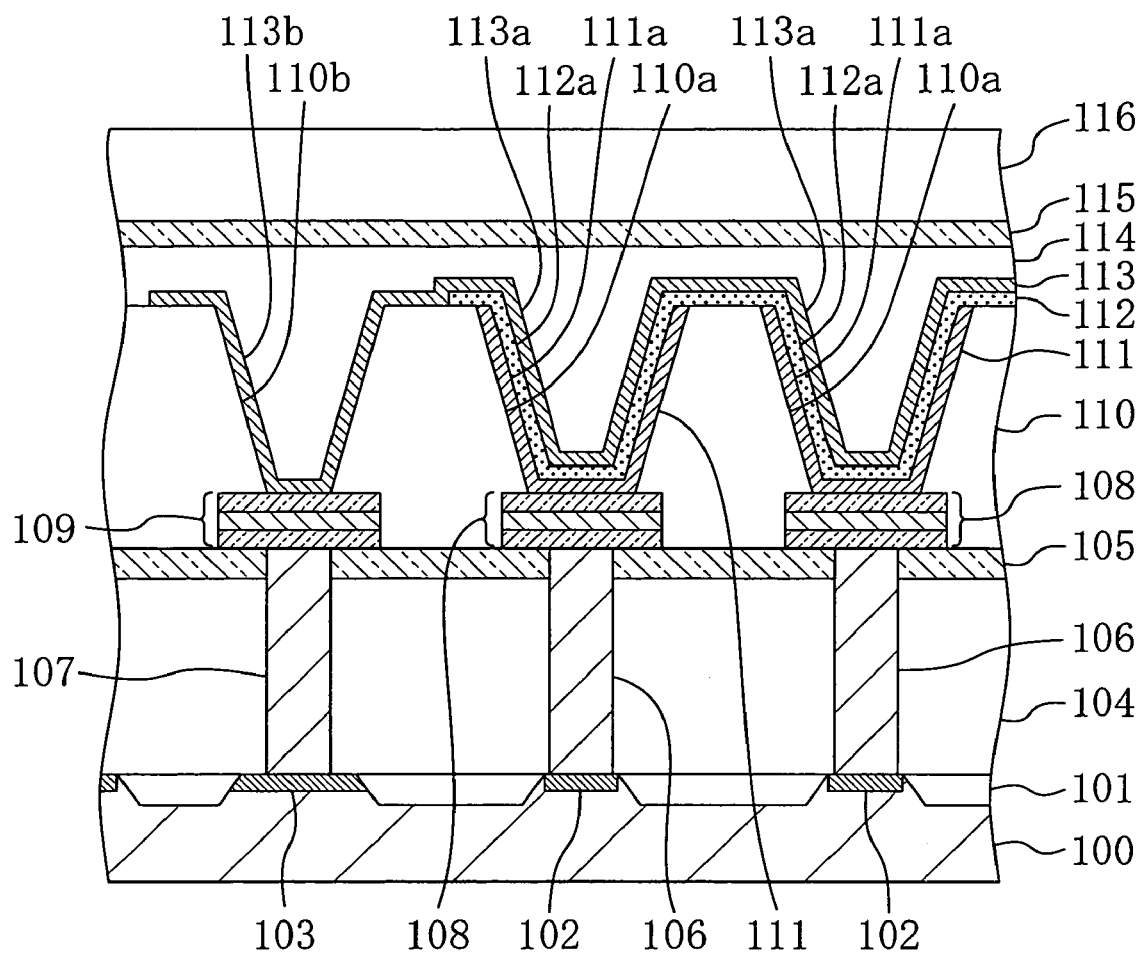
FIG. 3 is a cross-sectional view illustrating a main portion of a structure of a semiconductor device according to a second modified example of the third embodiment.

FIG. 3 is a cross-sectional view illustrating a semiconductor device according to the second modified example. In FIG. 3, components corresponding to those of the semiconductor device shown in FIG. 1 are denoted by the same reference numerals.

As shown in FIG. 3, the semiconductor device of the second modified example is different from the semiconductor devices shown in FIGS. 1 and 2 in that the ferroelectric film 112 is not present on the edge of the second opening 110b. Specifically, as in a cell plate structure of a memory cell, for example, the ferroelectric film 112 is previously patterned so that a portion of the ferroelectric film 112, miniaturization of which is difficult, has been removed at the formation of the second opening 110b. With this structure, patterning of only the second insulating film 110 is enough to form the second opening 110b, thereby eliminating the need for processing of the ferroelectric film 112. This allows for the miniaturization of the second opening 110b without limitation of flexibility (difficulty) in processing of the ferroelectric film 112.

THIRD MODIFIED EXAMPLE

Figure 4:
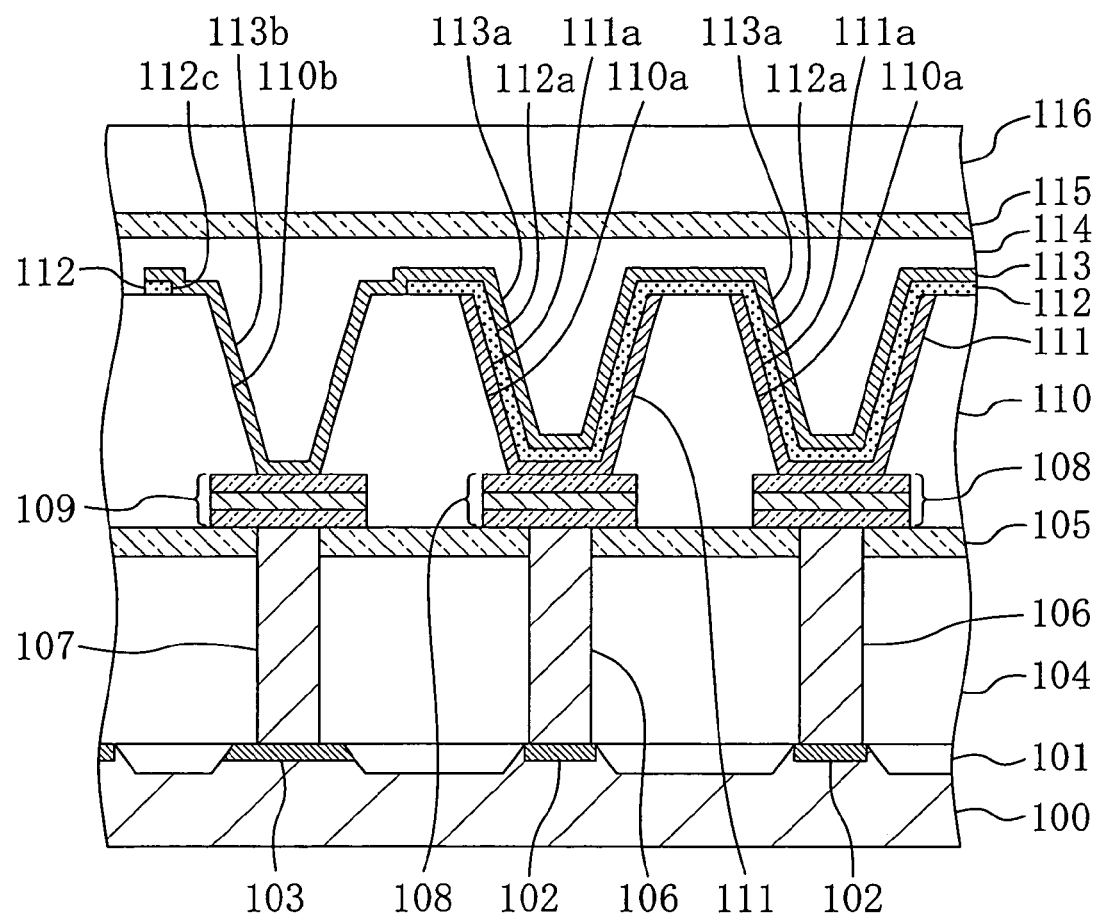
FIG. 4 is a cross-sectional view illustrating a main portion of a structure of a semiconductor device according to a third modified example of the first embodiment.

FIG. 4 is a cross-sectional view illustrating a semiconductor device according to a third modified example of the first embodiment. In FIG. 4, components corresponding to those of the semiconductor device shown in FIG. 1 are denoted by the same reference numerals.

As shown in FIG. 4, the semiconductor device of the third modified example is different from the semiconductor devices shown in FIGS. 1 and 2 in that that the ferroelectric film 112 is not present on the edge of the second opening 110b. In addition, the semiconductor device of the third modified example is different from the semiconductor device shown in FIG. 3 in that a seventh opening 112c having an aperture size larger than that of the second opening 110b is formed in the ferroelectric film 112.

With this structure, though the number of masking processes of patterning the ferroelectric film 112, the second metal film 113 and the second opening 110b is three, which is equal to that in the second modified example (i.e., processing of the ferroelectric film 112 (first time)→processing of the second opening 110b (second time)→processing of the first metal film (third time)), alignment margins between the ferroelectric film 112 and the second metal film 113 are unnecessary, and miniaturization is achieved accordingly. This is because in the third modified example, after the processings of the seventh opening 112c (first time) and the second opening 110b (second time) formed in the ferroelectric film 112, the ferroelectric film 112 and the second metal film 113 are processed at the same time (third time).

FOURTH MODIFIED EXAMPLE

Figure 5:
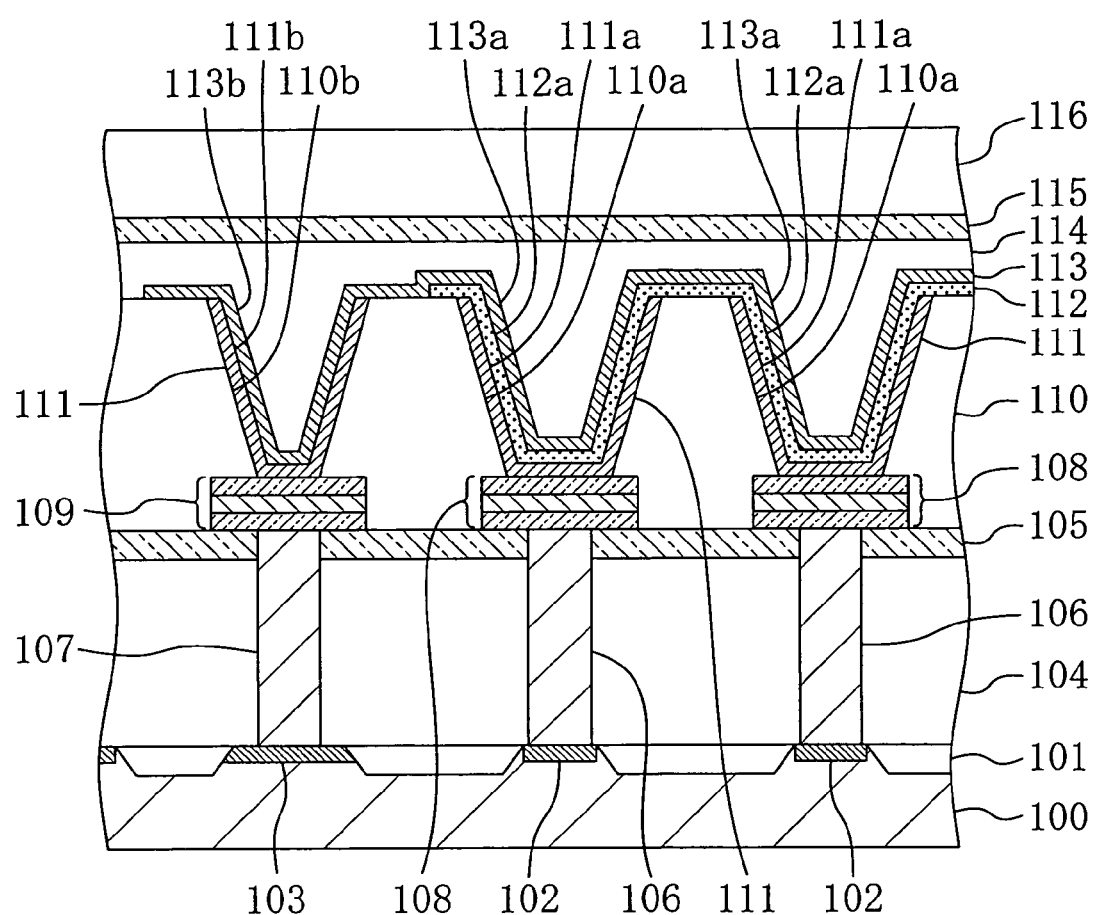
FIG. 5 is a cross-sectional view illustrating a main portion of a structure of a semiconductor device according to a fourth modified example of the first embodiment.

FIG. 5 is a cross-sectional view illustrating a semiconductor device according to a fourth modified example of the first embodiment. In FIG. 5, components corresponding to those of the semiconductor device shown in FIG. 1 are denoted by the same reference numerals.

As shown in FIG. 5, the semiconductor device of the fourth modified example is different from the semiconductor device shown in FIG. 3 in that the first metal films 111 are formed not only on the walls and bottoms of the first openings 110a but also on the wall and bottom of the second opening 110b. Specifically, a first metal film 111 including an eighth opening 111b is formed on the wall and bottom of the second opening 110b. Then, the second metal film 113 is formed on the ferroelectric film 112 including the walls and bottoms of the fourth openings 112a, on the second insulating film 110 and over the wall and bottom of the eighth opening 111b.

With this structure, the first metal film 111 underlying the second metal film 113 is present on the wall and bottom of the second opening 110b and these metal films are tightly in contact with each other, so that peeling of the second metal film 113 from the second insulating film 110 that might occur when the second metal film 113 is directly formed on the wall and bottom of the second opening 110b is prevented. Accordingly, a material for the second metal film serving as the upper electrode is freely selected irrespective of an insulating material.

FIFTH MODIFIED EXAMPLE

Figure 6:
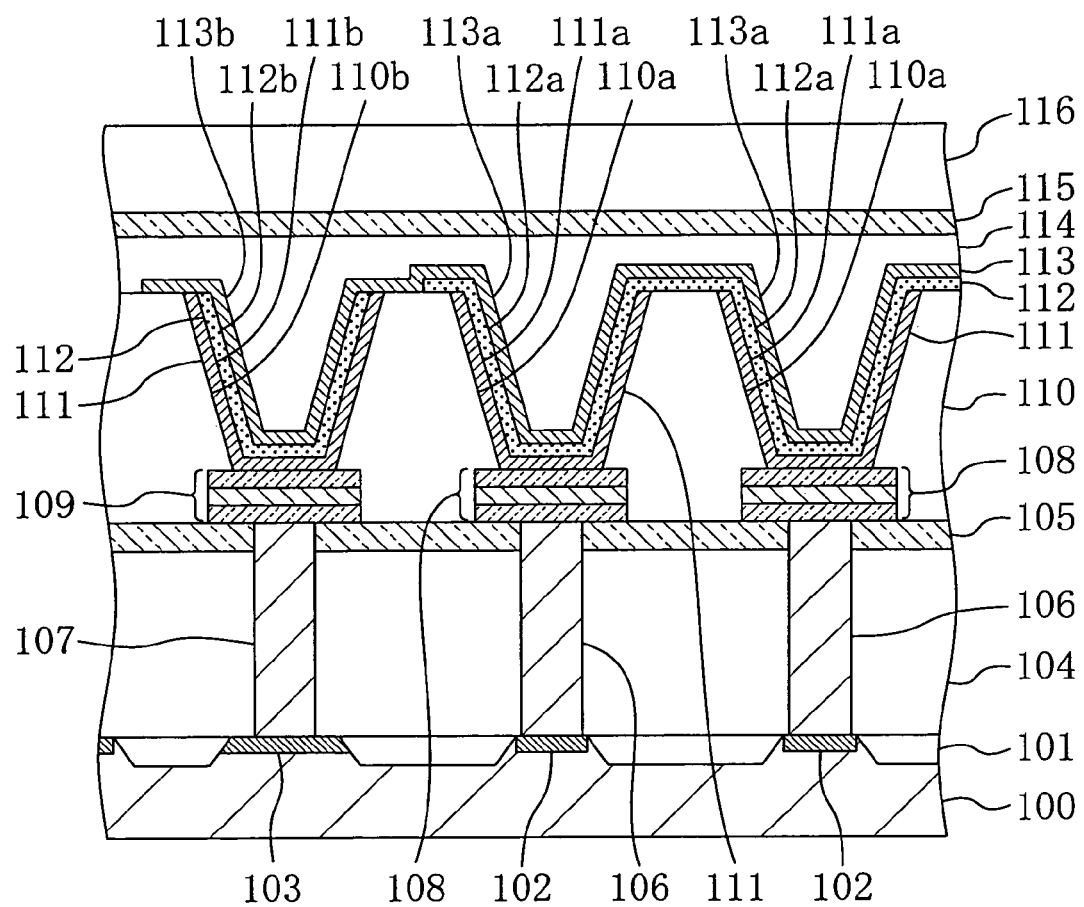
FIG. 6 is a cross-sectional view illustrating a main portion of a structure of a semiconductor device according to a fifth modified example of the first embodiment.
Figure 7:
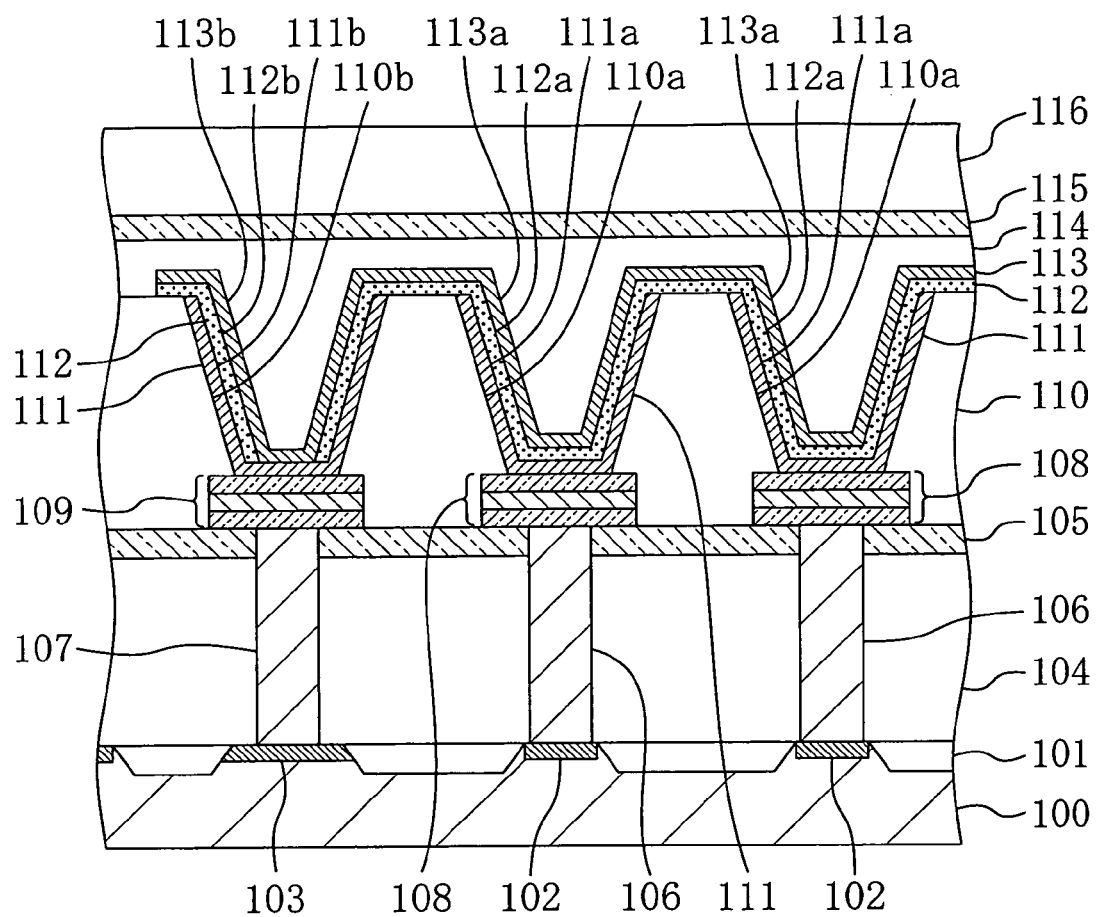
FIG. 7 is a cross-sectional view illustrating a main portion of a structure of a semiconductor device according to the fifth modified example of the first embodiment.

FIGS. 6 and 7 are cross-sectional views illustrating respective semiconductor devices according to a fifth modified example of the first embodiment. In FIGS. 6 and 7, components corresponding to those of the semiconductor device shown in FIG. 1 are denoted by the same reference numerals.

The semiconductor device shown in FIG. 6 is different from the semiconductor device shown in FIG. 5 in that the ferroelectric films 112 are formed not only on the walls and bottoms of the third openings 111a but also on the wall and bottom of the eighth opening 111b of the first metal films 111 formed along the wall and bottom of the second opening 110b. Specifically, the ferroelectric film 112 having a ninth opening 112b is formed on the wall and bottom of the eighth opening 111b. The second metal film 113 is formed on the ferroelectric films 112 including the walls and bottoms of the fourth openings 112a, on the second insulating film 110, and on the wall and bottom of the ninth opening 112b. In this case, the second metal film 113 serving as an upper electrode is in contact with the ends of the first metal film 110b formed on the wall of the second opening 110b.

The semiconductor device shown in FIG. 7 is different from the semiconductor device shown in FIG. 5 in that the ferroelectric film 112 is formed on the wall and bottom of the third opening 111b except for the bottom of the eighth opening 111b of the first metal films 111 formed on the walls and bottoms of the second opening 110a, on the second insulating film 110, and on the wall of the ninth opening 112b. In this case, the second metal film 113 serving as an upper electrode is in contact with part of the first metal film 111b located on the bottom of the second opening 110b.

In this manner, when the structures shown in FIGS. 6 and 7 are adopted, the materials stacked in the first openings 110a and the materials stacked in the second opening 110b are identical. Accordingly, the potential of the upper electrode is easily drawn to the second doped layer 110b. The first metal film 111 and the second metal film 113 are in contact with each other within the second opening 110b in both cases of FIGS. 6 and 7, so that miniaturization is achieved, as compared to a case where these films are in contact with each other in a portion of the first metal films 111 extending off the second opening 110b. In addition, since the contact portion is formed between the metal films, this contact portion is tighter than a contact between a metal film and an insulating film, so that no peeling occurs at the contact portion and disconnection is prevented.

Embodiment 2

Hereinafter, a method for fabricating a semiconductor device according to a second embodiment of the present invention will be described with reference to FIGS. 8A through 8C, FIGS. 9A and 9B, FIGS. 10A and 10B and FIGS. 11A and 11B. These drawings are cross-sectional views showing respective process steps in the case of fabricating the semiconductor device of the first embodiment shown in FIG. 2. In the drawings, components corresponding to those of the semiconductor device shown in FIG. 2 are denoted by the same reference numerals.

Figure 8A:
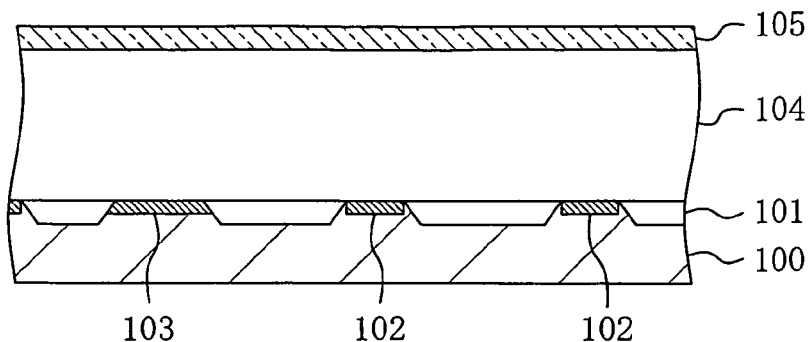
FIGS. 8A through 8C are cross-sectional views showing respective process steps of a method for fabricating a semiconductor device according to a second embodiment of the present invention.

First, as shown in FIG. 8A, isolation regions (STI) 101 defining transistor regions are formed in the semiconductor substrate 100 and a first doped layer (first conductive layer)

102 and a second doped layer (second conductive layer) 103 are formed. A cobalt silicide ($CoSi_2$) may be formed on the surfaces of the first doped layer 102 and the second doped layer 103. In this case, delay in circuit operation is prevented so as to further reduce resistance. In FIG. 8A, the second conductive layer is the second doped layer 103 provided in the semiconductor substrate 100. Alternatively, a conductive layer included in a first insulating film 104, which will be described later, e.g., an interconnect using polysilicon or tungsten, may be used, for example. Then, a first insulating film 104 of a $SiO_2$ film with a thickness of 500 to 800 nm, for example, is formed to cover the semiconductor substrate 100, the isolation regions 101, the first doped layer 102 and the second doped layer 103. Thereafter, a first hydrogen barrier film 105 of a SiN film with a thickness of 20 to 800 nm, for example, is formed on the first insulating film 104. In this case, the case of forming the first hydrogen barrier film 105 is described. Alternatively, the first hydrogen barrier film 105 may be omitted, if not necessary.

Figure 8B:
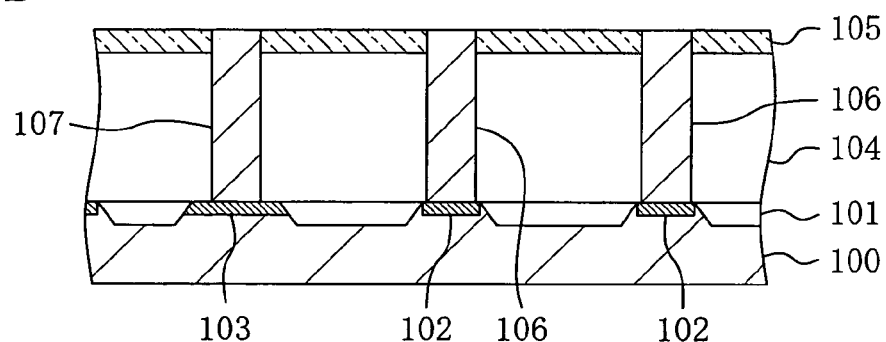

Next, as shown in FIG. 8B, first contact plugs (first plugs) 106 are formed through the first insulating film 104 and the first hydrogen barrier film 105 to be connected at their lower ends to the first doped layer 102. A second contact plug (second plug) 107 is formed through the first insulating film 104 and the first hydrogen barrier film 105 connected at its lower end to the second doped layer 103. The first contact plugs 106 and the second contact plug 107 are made of tungsten or polysilicon.

Figure 8C:
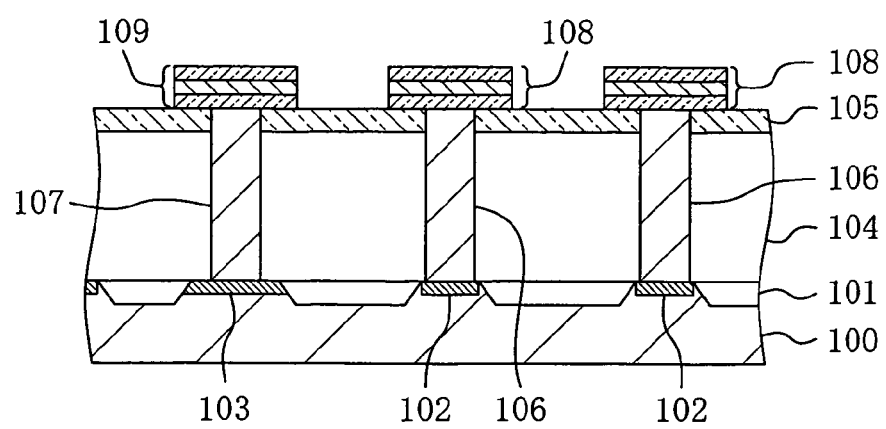

Then, as shown in FIG. 8C, conductive first oxygen barrier films 108 and a conductive second oxygen barrier film 109 as a stack of $IrO_2Ir/TiAlN$, for example, are formed on the first hydrogen barrier film 107 to cover the upper surfaces of the first contact plugs 106 and the second contact plug 107, respectively. The first oxygen barrier films 108 and the second oxygen barrier film 109 prevent oxidation of the first contact plugs 106 and the second contact plug 107 during heat treatment performed in an oxygen atmosphere for crystallization of a ferroelectric film 112, which will be described later. If the ferroelectric film 112 is crystallized at a sufficiently low temperature, the first oxygen barrier films 108 and the second oxygen barrier film 109 may be omitted. TiAlN as the lowermost layer of each of the first oxygen barrier films 108 and the second oxygen barrier film 109 also functions as a hydrogen barrier film.

Figure 9A:
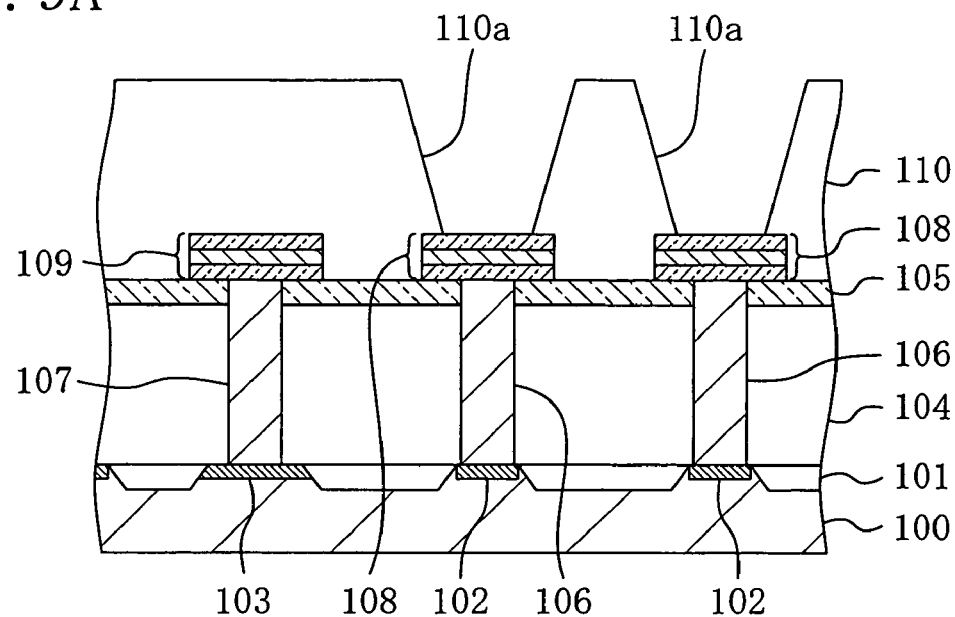
FIGS. 9A and 9B are cross-sectional views showing respective process steps of the method for fabricating a semiconductor device according to the second embodiment.

Thereafter, as shown in FIG. 9A, a second insulating film 110 of a $SiO_2$ film with a thickness of 700 to 1000 nm, for example, is formed on the first hydrogen barrier film 105 to cover the first oxygen barrier films 108 and the second oxygen barrier film 109. Then, first openings 110a in which the upper surfaces of the first oxygen barrier films 108 are exposed and a second opening 110b in which the upper surface of the second oxygen barrier film 109 is exposed are formed in the second insulating film 110 by photolithography and etching. Each of the openings has a tapered shape in cross section and has an aperture size that increases toward the top thereof, as shown in FIG. 9A. The first openings 110a, the first oxygen barrier films 108, the first contact plugs 106 and others are used to form capacitances of ferroelectric memories. Although not shown, a plurality of structures having the same shape are formed to the right of the drawing. The second opening 110b is formed to draw the potential of an upper electrode, which will be described later, to the second doped layer 103. Therefore, one second opening 110b is sufficient for a plurality of ferroelectric memories described above (e.g., cell plates of memory cells). In this embodiment, the first openings 110a are formed by photolithography and etching. However, any method may be used as long as an opening is formed. For example, a method for depositing an insulating film having an opening may be used.

Figure 9B:
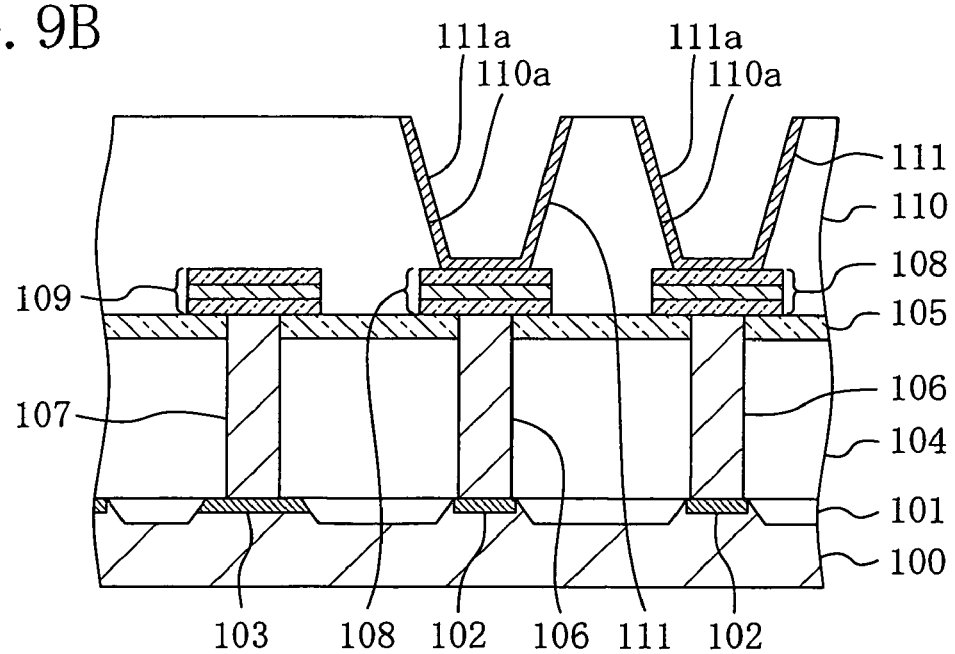

Subsequently, as shown in FIG. 9B, first metal films 111 in the shape of cylinders made of a noble metal typified by platinum or iridium or a metal oxide containing such a metal and having third openings 111a are formed on the walls and bottoms of the first openings 110a. Specifically, a first metal film 110 is deposited over the entire surface of the second insulating film 110 including the walls and bottoms of the first openings 110a, and then CMP or an etch-back process is performed thereon such that parts of the first metal film 111 remain only on the walls and bottoms of the first openings 110a. The first metal films 111 serve as lower electrodes. In this manner, the first metal films 111 are formed only on the walls and bottoms of the first openings 110a in a self alignment manner, thus contributing further miniaturization of the semiconductor device.

In this embodiment, the first metal films 111 are formed only on the walls and bottoms of the first openings 110a. Alternatively, as in the structure shown in FIG. 1, a structure in which the ends of each of the first metal films 111 are located on the second insulating film 110 and extend outward across the edge of an associated one of the first openings 110a may be implemented by depositing the first metal film 111 over the entire surface of the second insulating film 110 including the walls and bottoms of the first openings 110a and then patterning the film with a desired mask. In such a case, alignment margins for use in forming the first metal films 111 in the first openings 110a by patterning are secured.

Figure 10A:
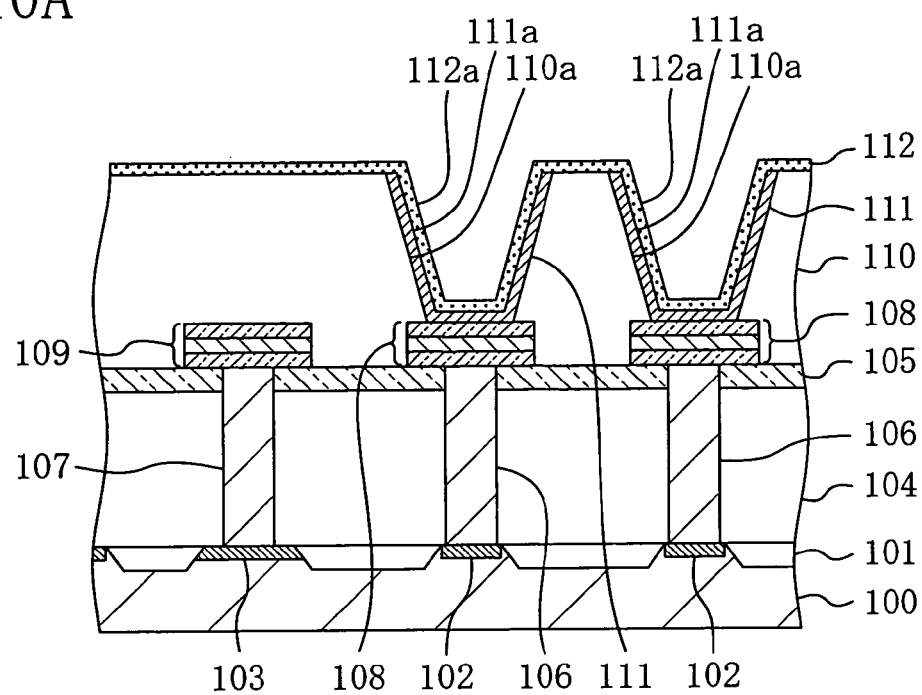
FIGS. 10A and 10B are cross-sectional views showing respective process steps of the method for fabricating a semiconductor device according to the second embodiment.

Then, as shown in FIG. 10A, a ferroelectric film 112 made of a SBT-based, PZT-based or BLT-based material, for example, and having fourth openings 112a is formed on the first metal films 111 having the third openings 111a and the entire surface of the second insulating film 110. The ferroelectric film 112 serves as a capacitive dielectric film.

Figure 10B:
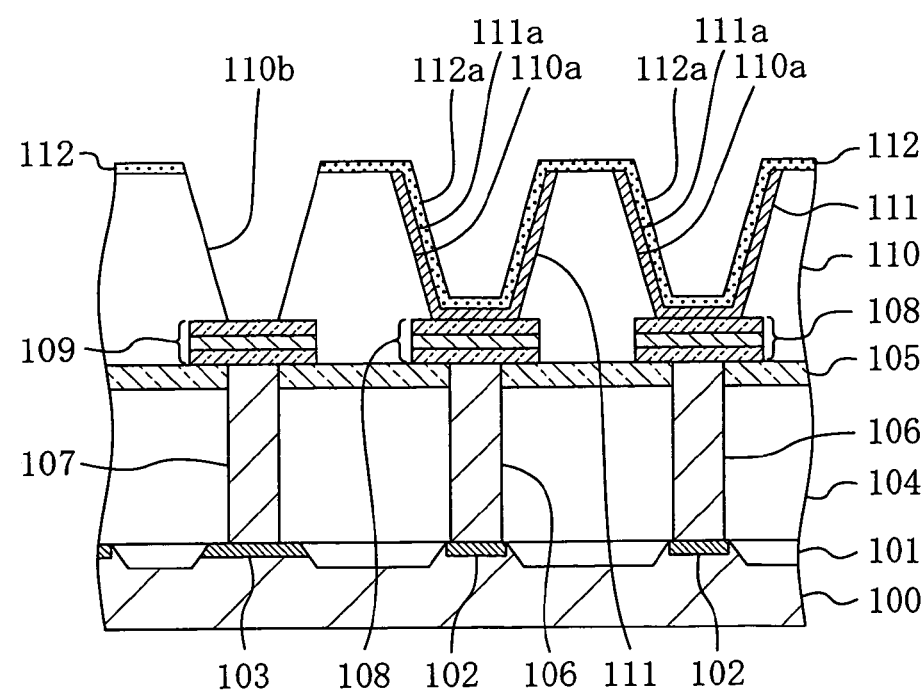

Thereafter, as shown in FIG. 10B, parts of the ferroelectric film 112 and the second insulating film 110 located above the second contact plug 109 are removed, thereby forming a second opening 110b in which the upper surface of the second oxygen barrier film 109 is exposed. The second opening 110b has a tapered shape and is smaller than the first openings 110a as shown in FIG. 10B. This allows for further miniaturization.

Figure 11A:
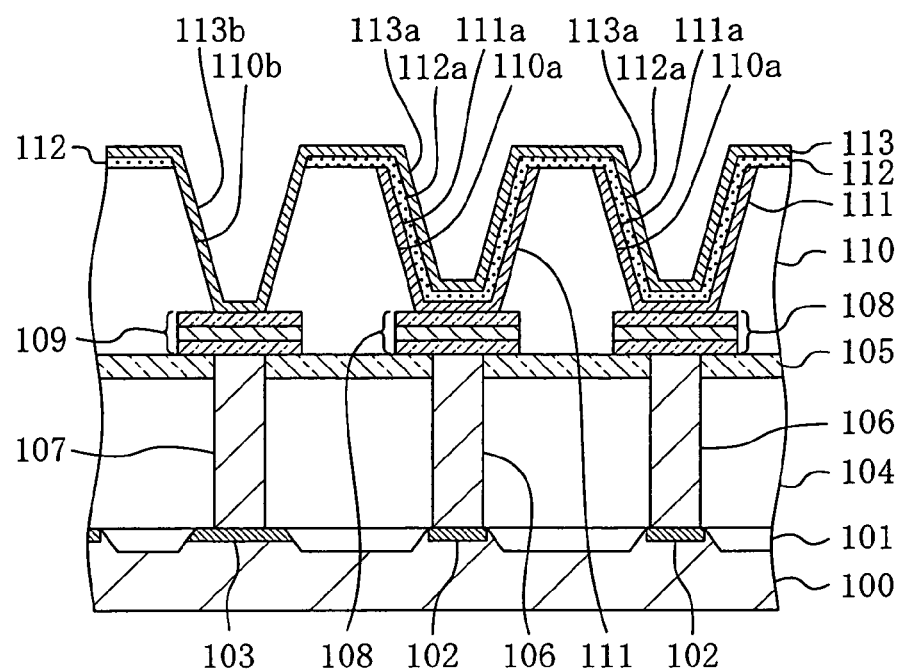
FIGS. 11A and 11B are cross-sectional views showing respective process steps of the method for fabricating a semiconductor device according to the second embodiment.

Subsequently, as shown in FIG. 11A, a second metal film 113 made of a noble metal typified by platinum or iridium or a metal oxide containing such a metal and having fifth openings 113a and a sixth opening 113b is formed on the ferroelectric film 112 including the walls and bottoms of the fourth openings 112a and on the wall and bottom of the second opening 110b. The second metal film 113 serves as a lower electrode.

Figure 11B:
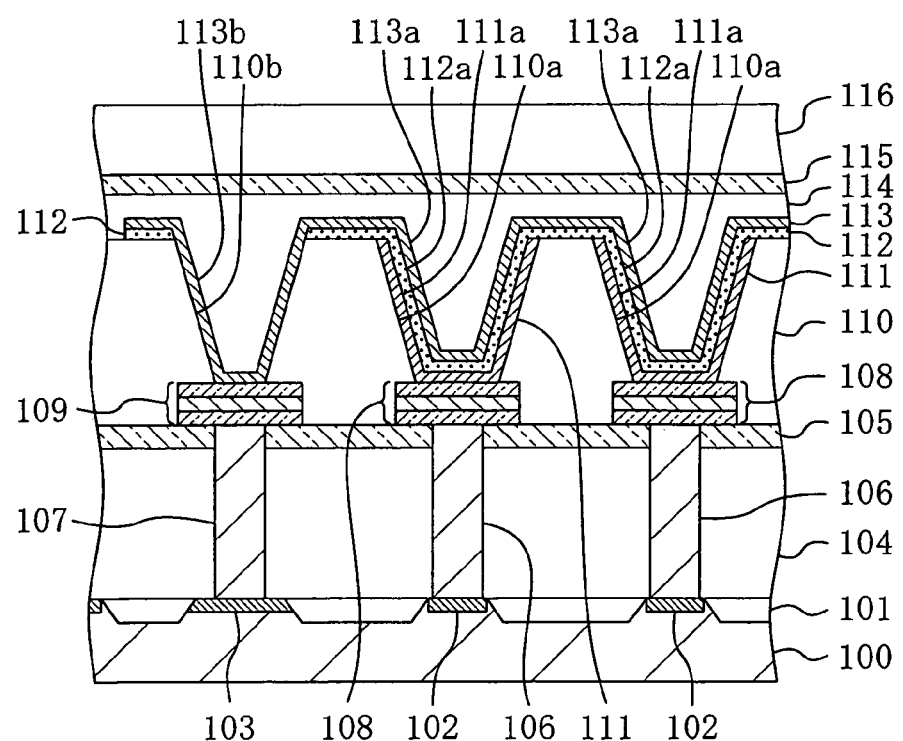

Then, as shown in FIG. 11B, the ferroelectric film 112 and the second metal film 113 are patterned at the same time. It is, of course, unnecessary to use different masks for the patterning performed at the same time. Thereafter, a third insulating film 114 with a thickness of 50 to 300 nm, for example, is formed on the second metal film 113 including the fifth openings 113a and the sixth opening 113b and the second insulating film 110. Then, a second hydrogen barrier film 115 is formed on the third insulating film 114. If the ferroelectric film 112 made of a ferroelectric material having reduction resistance is used, the first hydrogen barrier film 105 and the second hydrogen barrier film 115 may be omitted. However, in general, a combination of hydrogen barrier films is used to connect the first hydrogen barrier film 105 and the second hydrogen barrier film 112 to each other at an end of a memory cell, so that a region including the portion for drawing the potential of the upper electrode to the second doped layer 103 is completely covered with the hydrogen barrier films. This ensures prevention of characteristic deterioration of ferroelectric capacitors caused by hydrogen.

Subsequently, a fourth insulating film 116 with a thickness of 100 to 300 nm, for example, is formed on the second hydrogen barrier film 115. Though not shown, general interconnects and others are formed on the fourth insulating film 116.

As described above, with the method for fabricating the semiconductor device of the second embodiment, ferroelectric capacitors constituted by lower electrodes made of the first metal films 111, the capacitive dielectric film made of the ferroelectric film 112 and the upper electrode made of the second metal film 113 are formed in at least the first openings 110a. The second metal film 113 extends from portions on cover the ferroelectric film 112 including the walls and bottoms of the fourth openings 112a to the wall and bottom of the second opening 110b, so that the upper electrode and the second doped layer 103 are connected to each other via the second oxygen barrier film 109 and the second contact plug 107 formed under the bottom of the second opening 110b. In this manner, the potential of the upper electrode is electrically connected to the second doped layer 103 through the first and second interlayer insulating films 104 and 110. This suppresses decrease of a contact yield due to a high aspect ratio occurring when the upper electrode and the second doped layer 103 are directly connected to each other. In addition, the use of the second contact plug 107 formed simultaneously with the first contact plugs 106 serving as storage node contact plugs prevents the number of fabrication process steps of a semiconductor fabrication device from increasing.

Hereinafter, modified examples of the second embodiment will be described.

FIRST MODIFIED EXAMPLE

FIGS. 12A and 12B, FIGS. 13A and 13B and FIGS. 14A and 14B are cross-sectional views showing respective process steps of a method for fabricating a semiconductor device according to a first modified example of the second embodiment. These drawings are cross-sectional views showing respective process steps in the case of fabricating the semiconductor device of the first embodiment shown in FIG. 3. In the drawings, components corresponding to those of the semiconductor device shown in FIG. 3 are denoted by the same reference numerals.

Figure 12A:
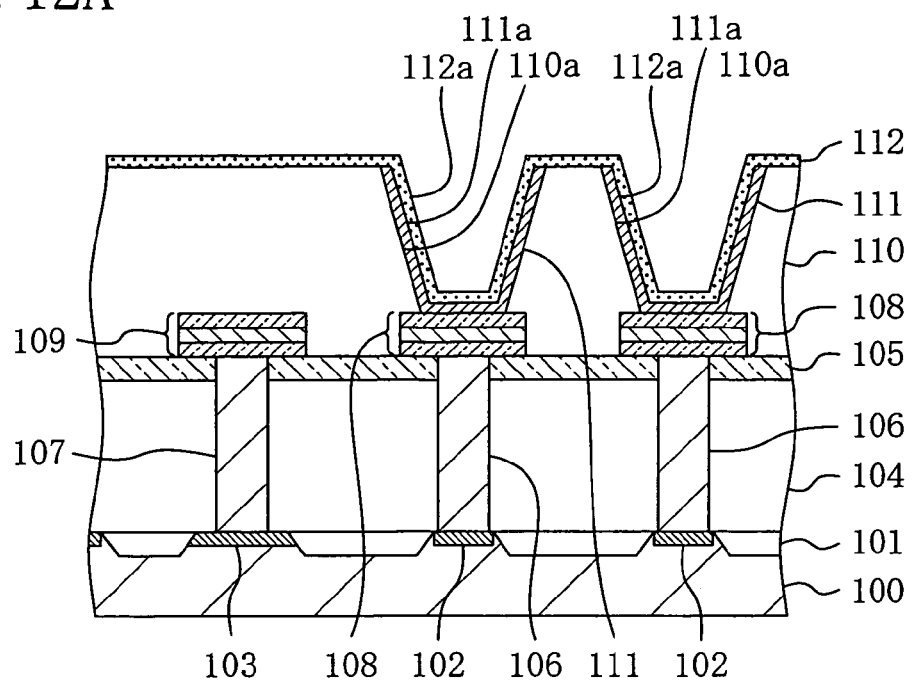
FIGS. 12A and 12B are cross-sectional views showing respective process steps of a method for fabricating a semiconductor device according to a first modified example of the second embodiment.

First, process steps up to fabrication of the semiconductor device shown in the cross-sectional view of FIG. 12A are the same as those in the description using FIGS. 8A through 8C, FIGS. 9A and 9B and FIG. 10A, and description thereof will be omitted.

Figure 12B:
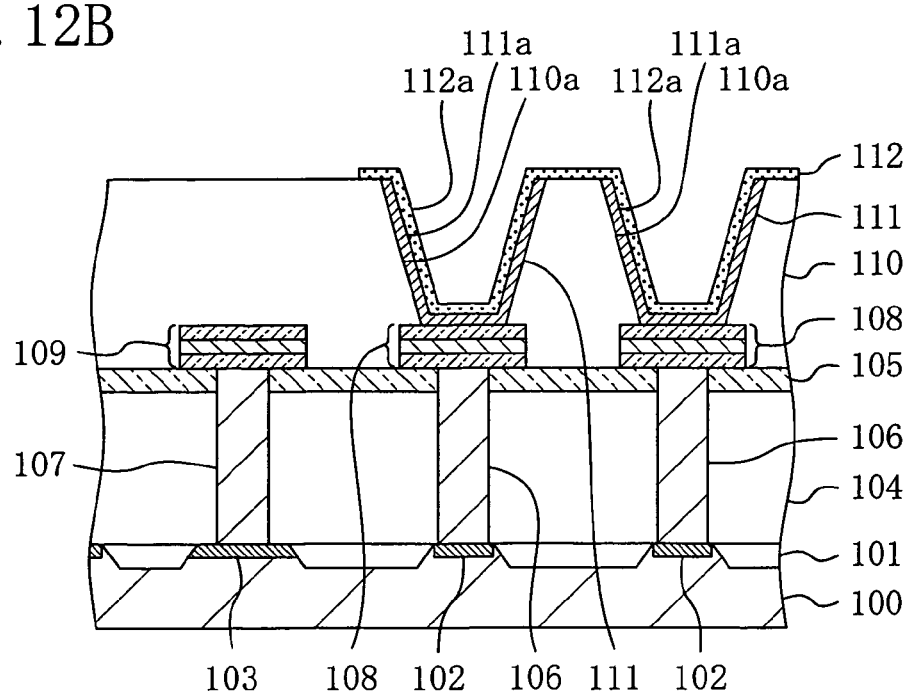

Next, as shown in FIG. 12B, a ferroelectric film 112 is patterned so as to form cell plates constituted by the walls and bottoms of third openings 112a and the ferroelectric film 112. At this time, part of the ferroelectric film 112 located above second contact plug 107 which is a region where a second opening 110b is to be formed is removed.

Figure 13A:
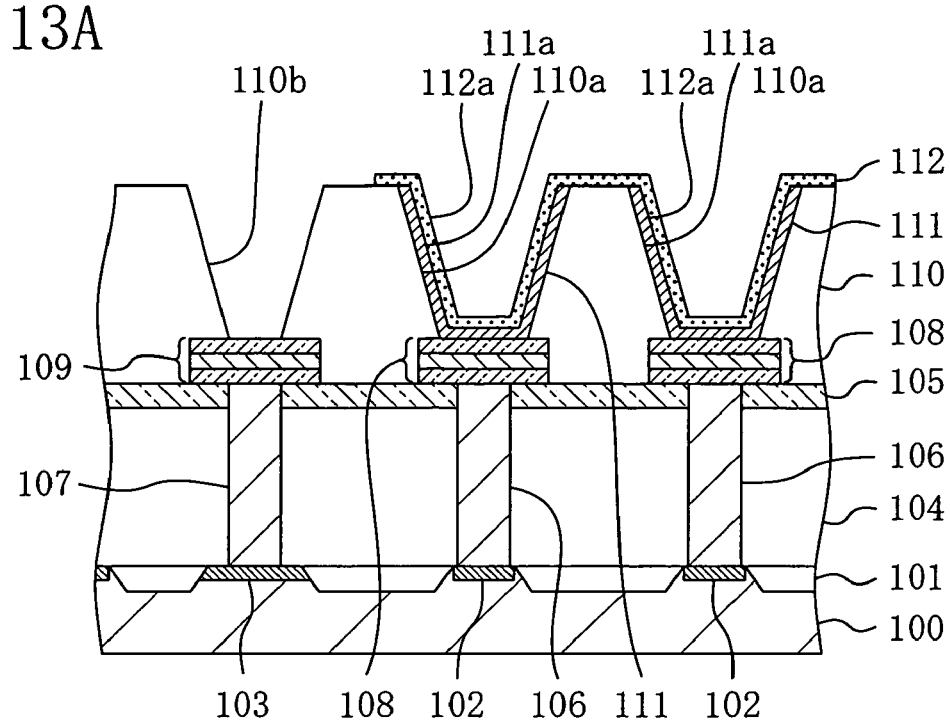
FIGS. 13A and 13B are cross-sectional views showing respective process steps of the method for fabricating a semiconductor device according to the first modified example of the second embodiment.

Then, as shown in FIG. 13A, part of the second insulating film 110 on which the ferroelectric film 112 is not present is removed, so that a second opening 110b in which the upper surface of a second oxygen barrier film 109 is exposed is formed through the second insulating film 110.

Figure 13B:
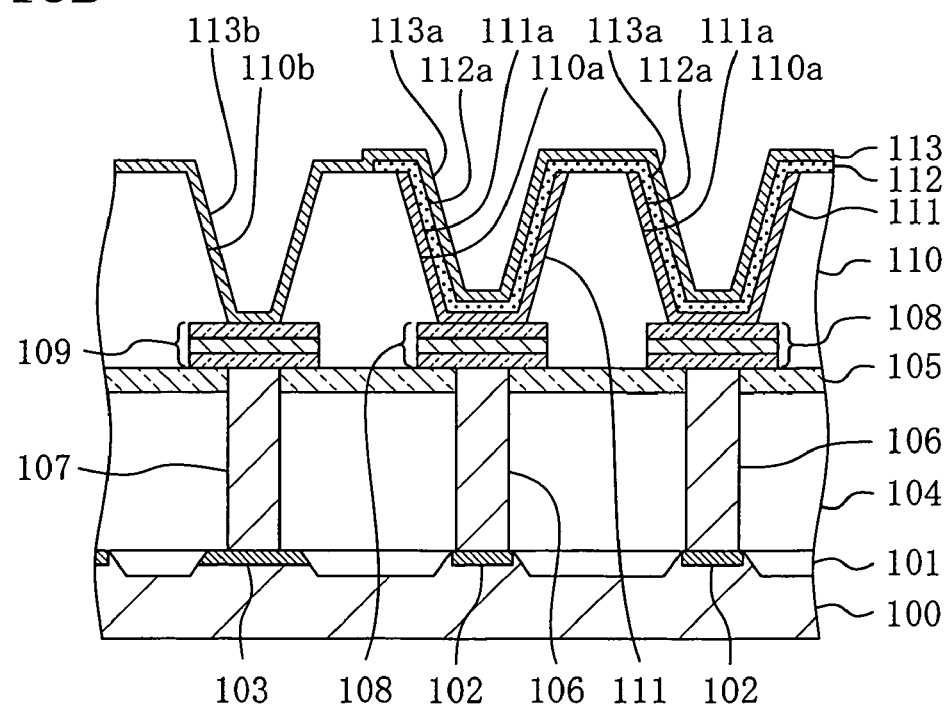

Thereafter, as shown in FIG. 13B, a second metal film 113 made of a noble metal typified by platinum or iridium or a metal oxide containing such a metal and having fifth openings 113a and a sixth opening 113b is formed on the second insulating film 110 including the second opening 110b and the ferroelectric film 112 including the walls and bottoms of the fourth openings 112a.

Figure 14A:
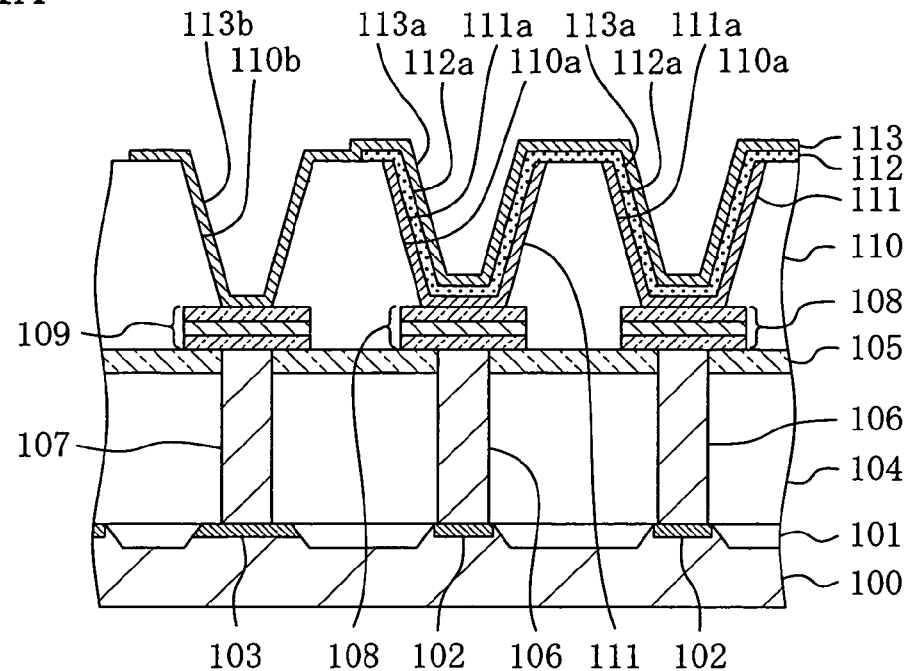
FIGS. 14A and 14B are cross-sectional views showing respective process steps of the method for fabricating a semiconductor device according to the first modified example of the second embodiment.

Subsequently, as shown in FIG. 14A, the second metal film 113 is patterned using a desired mask such that the ferroelectric film 112 is still covered therewith and the second metal film 113 remains on the wall and bottom of the second opening 110b.

Figure 14B:
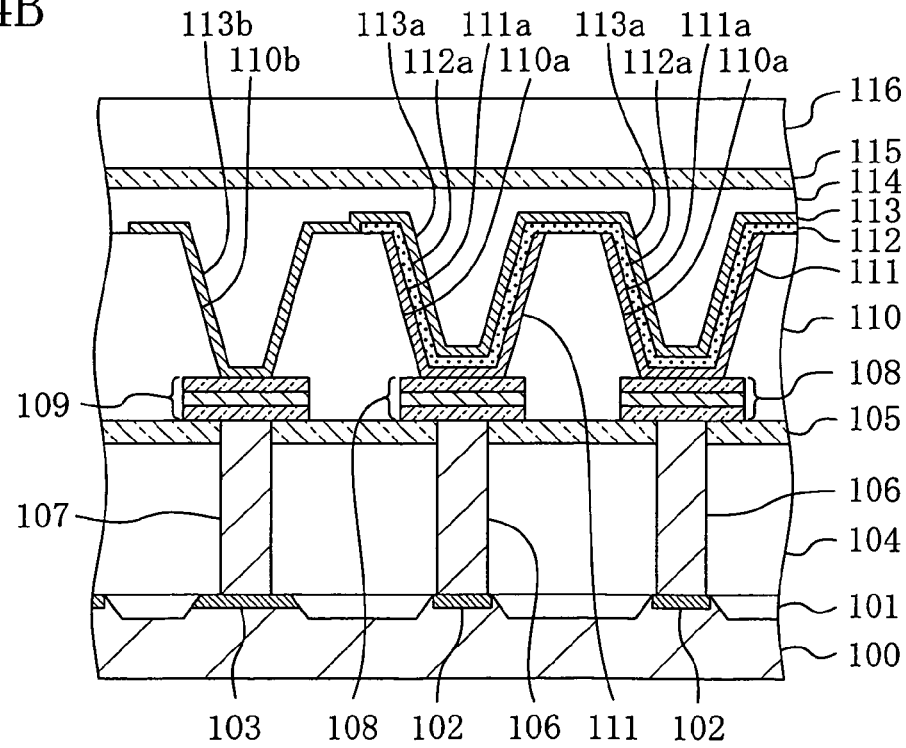

Then, as shown in FIG. 14B, a third insulating film 114 with a thickness of 50 to 300 nm, for example, is formed on the second metal film 113 including the fifth openings 113a and the sixth opening 113b and on the second insulating film 110. Thereafter, a second hydrogen barrier film 115 is formed on the third insulating film 114. Accordingly, a region including the portion for drawing the potential of an upper electrode to a second doped layer is completely covered with the hydrogen barrier films, in the same manner as described above. This ensures prevention of characteristic deterioration of ferroelectric capacitors caused by hydrogen. Subsequently, a fourth insulating film 116 with a thickness of 100 to 300 nm, for example, is formed on the second hydrogen barrier film 115. Though not shown, general interconnects and others are formed on the fourth insulating film 115.

In this manner, with the method for fabricating the semiconductor device according to the first modified example, the ferroelectric film 112 is patterned before the second opening 110b is formed, so that patterning of only the second insulating film 110 is sufficient and processing of the ferroelectric film is unnecessary. This enables miniaturization of the second opening 110b without limitation of flexibility (difficulty) in processing of the ferroelectric film 112.

SECOND MODIFIED EXAMPLE

FIGS. 15A and 15B, FIGS. 16A and 16B and FIGS. 17A and 17B are cross-sectional views showing respective process steps of a method for fabricating a semiconductor device according to a second modified example of the second embodiment. These drawings are cross-sectional views showing respective process steps in the case of fabricating the semiconductor device of the first embodiment shown in FIG. 4. In the drawings, components corresponding to those of the semiconductor device shown in FIG. 4 are denoted by the same reference numerals.

Figure 15A:
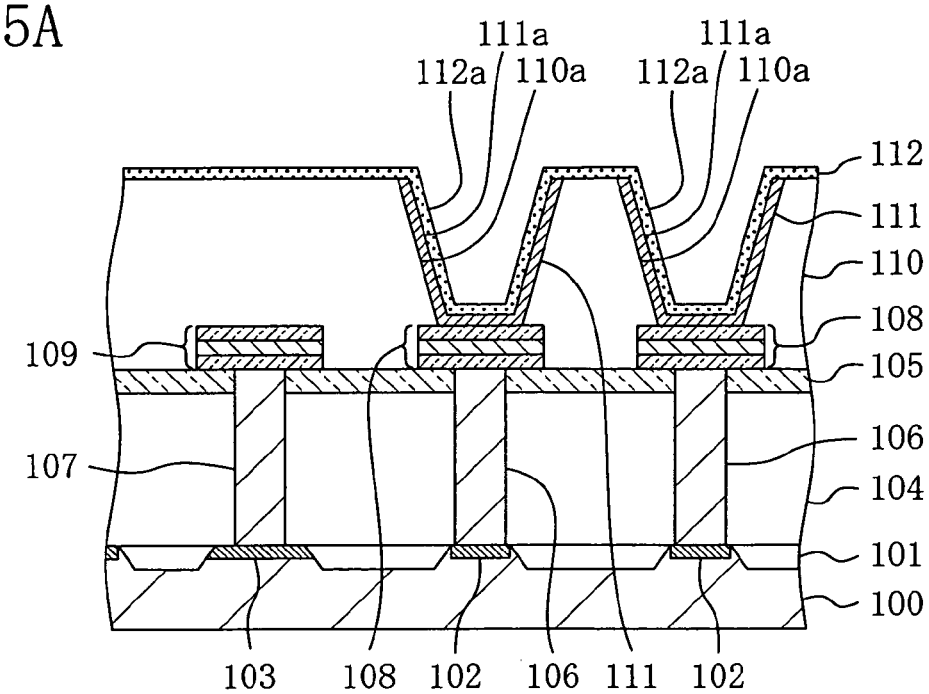
FIGS. 15A and 15B are cross-sectional views showing respective process steps of the method for fabricating a semiconductor device according to a second modified example of the second embodiment.

First, process steps up to fabrication of the semiconductor device shown in the cross-sectional view of FIG. 15A are the same as those in the description using FIGS. 8A through 8C, FIGS. 9A and 9B and FIG. 10A, and description thereof will be omitted.

Figure 15B:
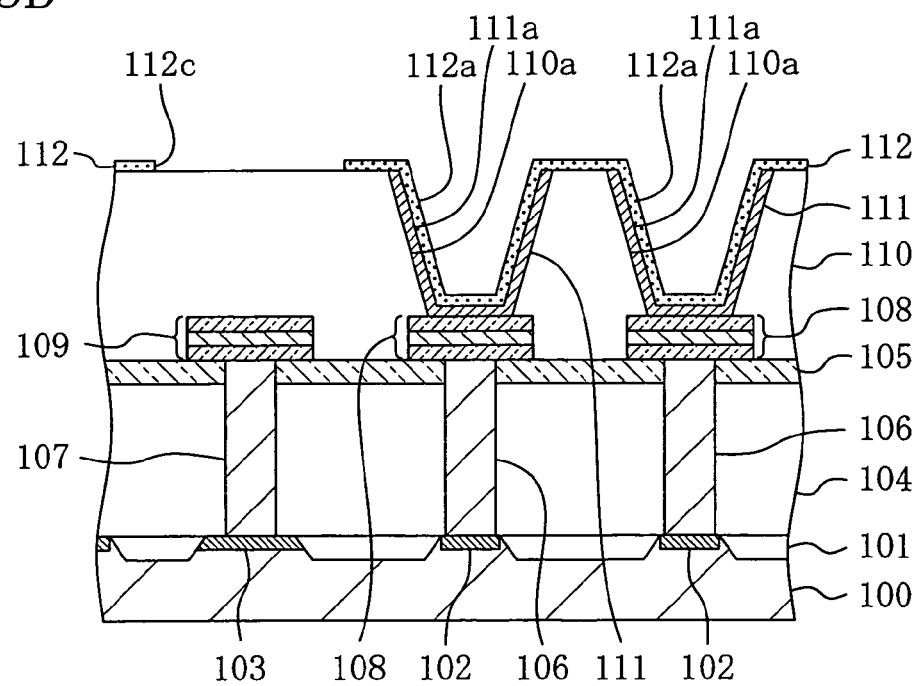

Next, as shown in FIG. 15B, a seventh opening 112c having an aperture size larger than that of a second opening 110b, which will be formed later, is formed in a ferroelectric film 112. The seventh opening 112c is formed such that part of the upper surface of a second insulating film 110 located above a second contact plug 107 is exposed in the seventh opening 112c.

Figure 16A:
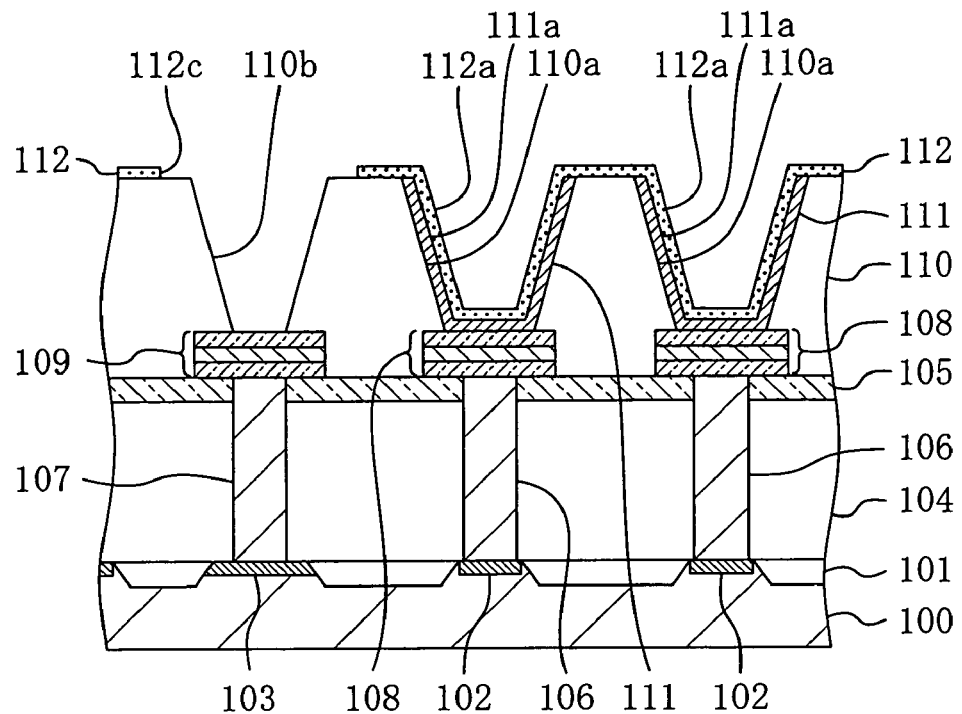
FIGS. 16A and 16B are cross-sectional views showing respective process steps of the method for fabricating a semiconductor device according to the second modified example of the second embodiment.

Thereafter, as shown in FIG. 16A, part of the second insulating film 110 exposed in the seventh opening 112c is removed so that a second opening 110b in which the upper surface of the second oxygen barrier film 109 is exposed is formed through the second insulating film 110.

Figure 16B:
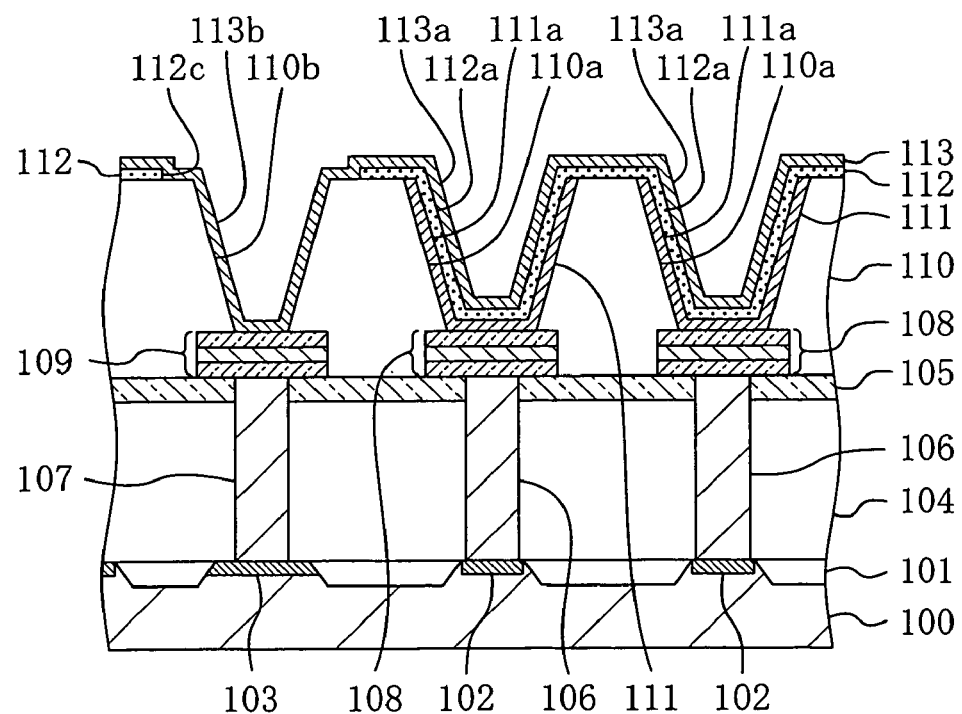

Then, as shown in FIG. 16B, a second metal film 113 made of a noble metal typified by platinum or iridium or a metal oxide containing such a metal and having fifth openings 113a and a sixth opening 113b is formed on the second insulating film 110 including the second opening 110b and the seventh opening 112c and on the ferroelectric film 112 including the walls and bottoms of fourth openings 112a.

Figure 17A:
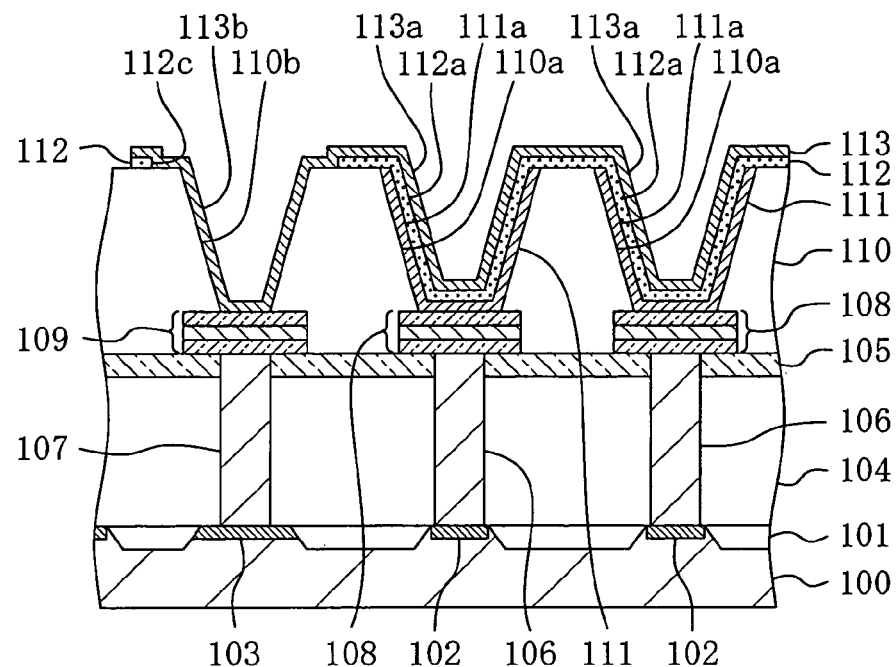
FIGS. 17A and 17B are cross-sectional views showing respective process steps of the method for fabricating a semiconductor device according to the second modified example of the second embodiment.

Subsequently, as shown in FIG. 17A, the second metal film 113 is patterned such that the ferroelectric film 112 is still covered therewith and the second metal film 113 remains on the wall and bottom of the second opening 110b (cell plate formation).

Figure 17B:
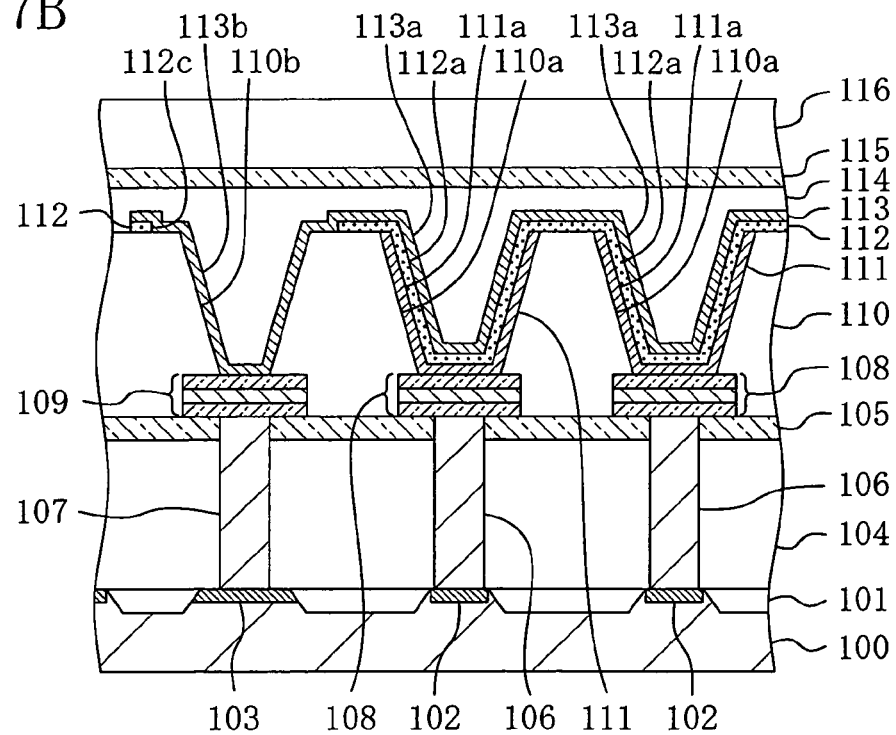

Then, as shown in FIG. 17B, a third insulating film 114 with a thickness of 50 to 300 nm, for example, is formed on the second metal film 113 including the fifth openings 113a and the sixth opening 113b and on the second insulating film 110. Thereafter, a lo second hydrogen barrier film 115 is formed on the third insulating film 114. Accordingly, a region including the portion for drawing the potential of an upper electrode to a second doped layer is completely covered with the hydrogen barrier films, in the same manner as described above. This ensures prevention of characteristic deterioration of ferroelectric capacitors caused by hydrogen. Subsequently, a fourth insulating film 116 with a thickness of 100 to 300 nm, for example, is formed on the second hydrogen barrier film 115. Though not shown, general interconnects and others are formed on the fourth insulating film 115.

In this manner, with the method for fabricating the semiconductor device according to the second modified example, though the number of masking processes of patterning the ferroelectric film 112, the second metal film 113 and the second opening 110b is three, which is equal to that in the first modified example (i.e., processing of the ferroelectric film 112 (first time)→processing of the second opening 110b (second time)→processing of the first metal film (third time)), alignment margins between the ferroelectric film 112 and the second metal film 113 are unnecessary and miniaturization is achieved accordingly. This is because in the second modified example, after the processings of the seventh opening 112c (first time) and the second opening 110b (second time) formed in the ferroelectric film 112, the ferroelectric film 112 and the second metal film 113 are processed at the same time (third time).

THIRD MODIFIED EXAMPLE

FIGS. 18A and 18B, FIGS. 19A and 19B, FIGS. 20A and 20B and FIGS. 20A and 20B are cross-sectional views showing respective process steps of a method for fabricating a semiconductor device according to a third modified example of the second embodiment. These drawings are cross-sectional views showing respective process steps in the case of fabricating the semiconductor device of the first embodiment shown in FIG. 5. In the drawings, components corresponding to those of the semiconductor device shown in FIG. 5 are denoted by the same reference numerals.

Figure 18A:
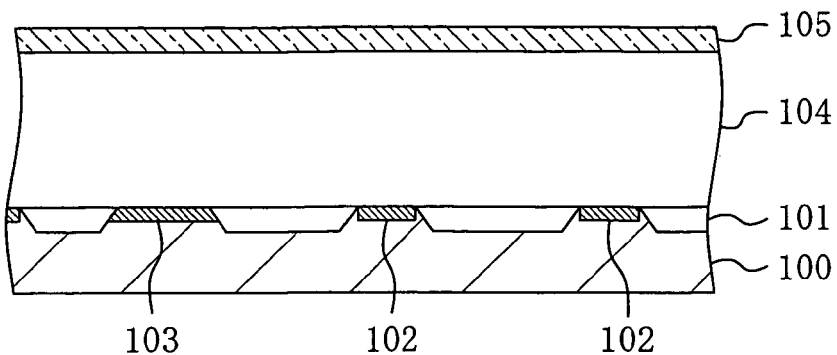
FIGS. 18A through 18C are cross-sectional views showing respective process steps of the method for fabricating a semiconductor device according to a third modified example of the second embodiment.
Figure 18B:
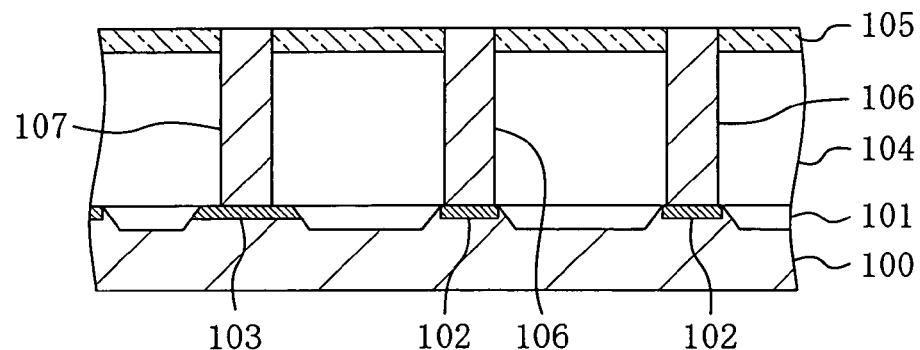
Figure 18C:
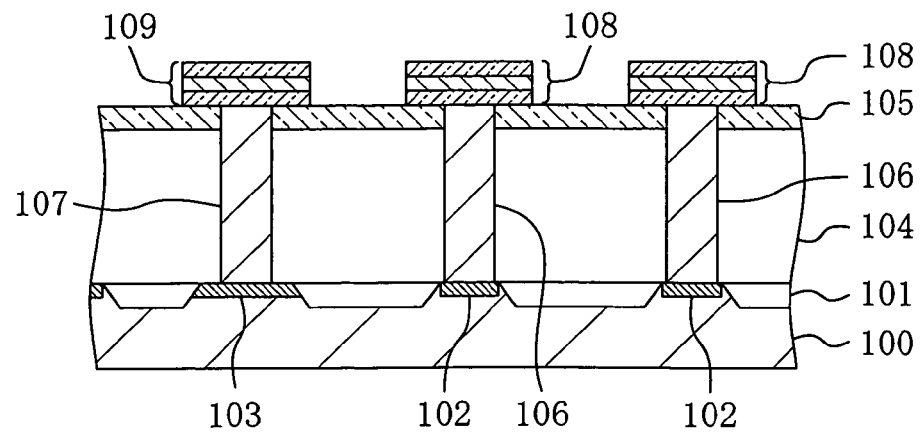

First, process steps shown in FIGS. 18A through 18C are the same as those shown in FIGS. 8A through 8C, and description thereof will be omitted.

Figure 19A:
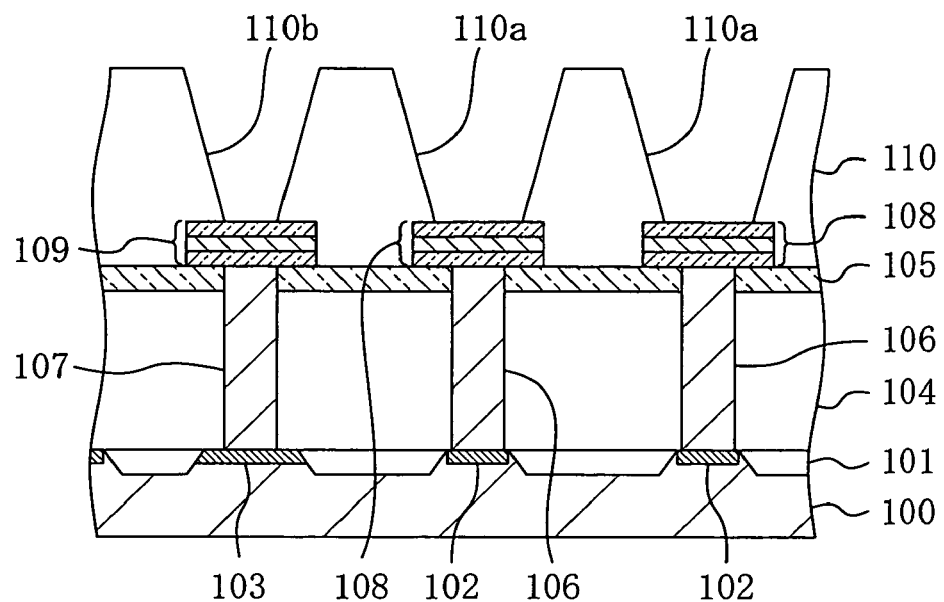
FIGS. 19A and 19B are cross-sectional views showing respective process steps of the method for fabricating a semiconductor device according to the third modified example of the second embodiment.

Next, as shown in FIG. 19A, a second insulating film 110 with a thickness of 700 to 1000 nm, for example, is formed on a second hydrogen barrier film 105 to cover first oxygen barrier films 108 and a second oxygen barrier film 109. Then, first openings 110a in which the upper surfaces of the first oxygen barrier films 108 are exposed and a second opening 110b in which the upper surface of the second oxygen barrier film 109 is exposed are formed at the same time in the second insulating film 110. Each of the first openings 110a, the first oxygen barrier films 108, the first contact plugs 106 and others are used to form capacitance of ferroelectric memories. Although not shown, a plurality of structures having the same shape are formed to the right of the drawing. The second opening 110b is formed to draw the potential of an upper electrode, which will be described later, to a second doped layer 103. Therefore, one second opening 110b is sufficient for a plurality of ferroelectric memories described above (e.g., cell plates of memory cells). Each of the first openings 110a and the second opening 110b has a tapered shape. The second opening 110b may have an aperture size smaller than that of the first openings 110a as shown in FIG. 19A, or may have the same aperture size. Since the second opening 110b does not form a capacitor and, therefore, can be formed small, thus achieving miniaturization.

Figure 19B:
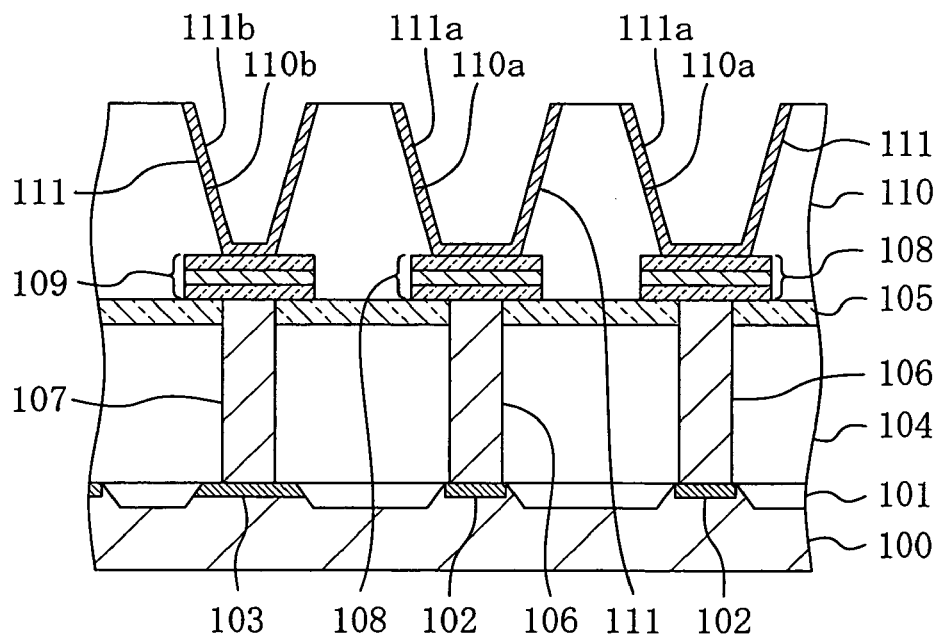

Then, as shown in FIG. 19B, a second metal film 113 made of a noble metal typified by platinum or iridium or a metal oxide containing such a metal is formed over the entire surface of the second insulating film 110 including the first openings 110a and the second opening 110b. Thereafter, CMP or an etch-back process is performed such that first metal films 111 in the shape of cylinders having third openings 111a and an eighth opening 111b are formed only on the walls and bottoms of the first openings 110a and on the wall and bottom of the second opening 110b.

Figure 20A:
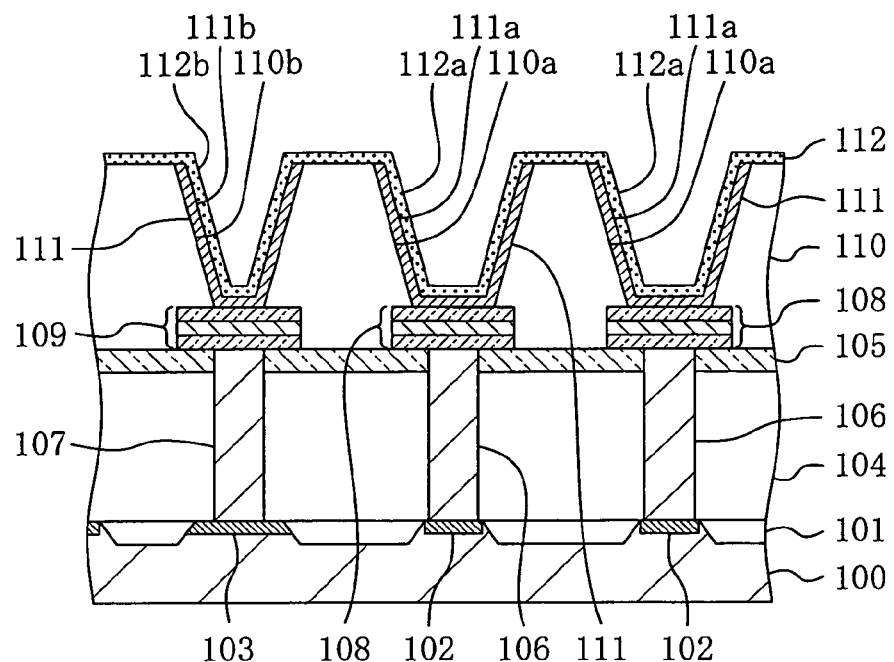
FIGS. 20A and 20B are cross-sectional views showing respective process steps of the method for fabricating a semiconductor device according to the third modified example of the second embodiment.

Thereafter, as shown in FIG. 20A, a ferroelectric film 112 made of a SBT-based, PZT-based or BLT-based material, for example, is formed on the entire surfaces of the first metal films 111 and the second insulating film 110.

Figure 20B:
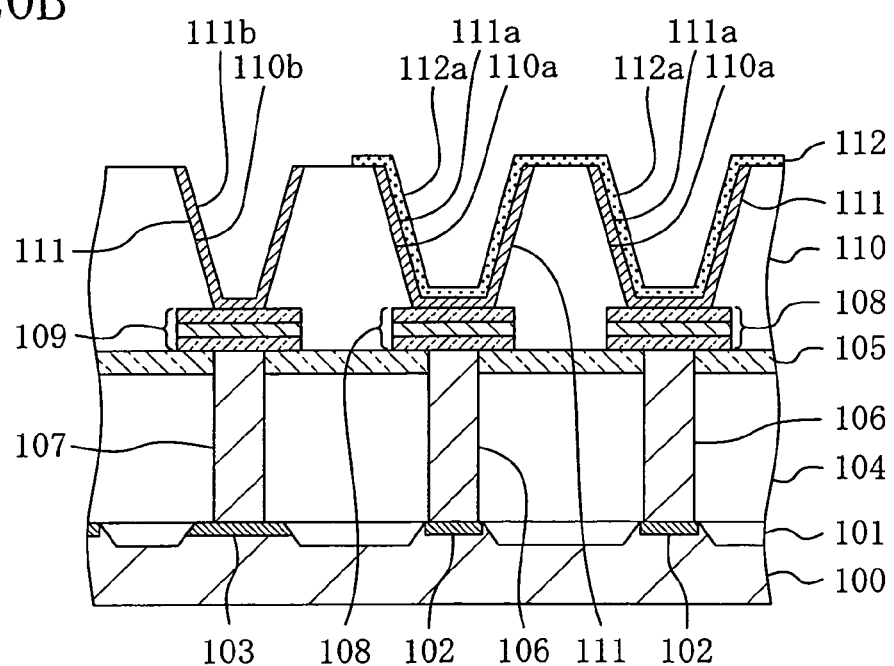

Subsequently, as shown in FIG. 20B, the ferroelectric film 112 is patterned such that cell plates including the ferroelectric film 112 is formed. At this time, parts of the ferroelectric film 112 remaining on the wall and bottom of the second opening 110b and near the edge of the second opening 110b are removed.

Figure 21A:
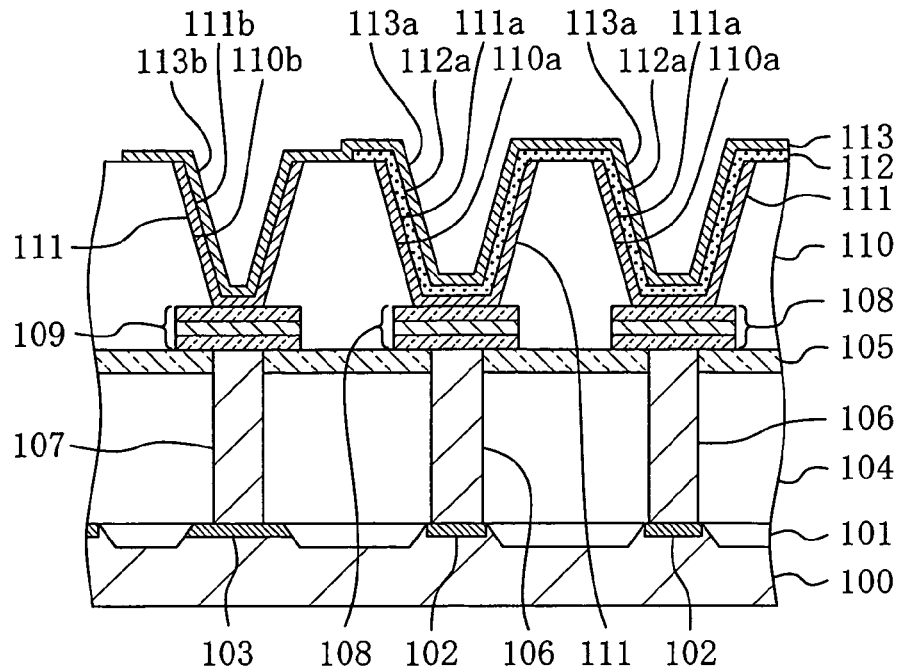
FIGS. 21A and 21B are cross-sectional views showing respective process steps of the method for fabricating a semiconductor device according to the third modified example of the second embodiment.

Then, as shown in FIG. 21A, a second metal film 113 made of a noble metal typified by platinum or iridium or a metal oxide containing such a metal and having fifth openings 113a and a sixth opening 113b is formed on the first metal films 111 including the eighth opening 111b, on the ferroelectric film 112 including the walls and bottoms of the fourth openings 112a, and on the entire surface of the second insulating film 110.

Figure 21B:
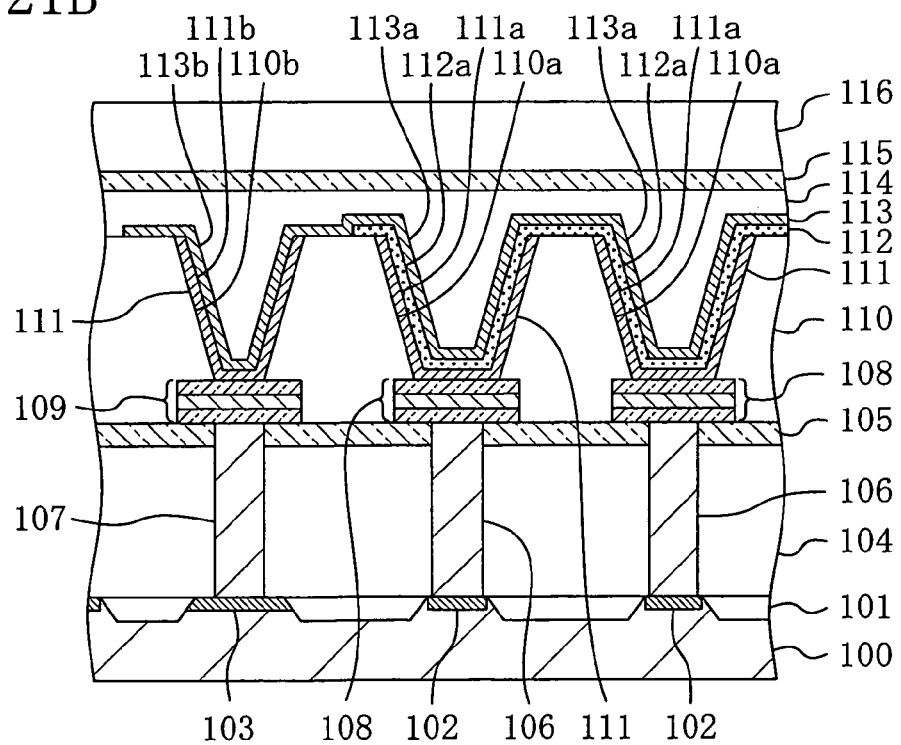

Subsequently, as shown in FIG. 21B, the second metal film 113 is patterned using a desired mask such that the ferroelectric film 112 is still covered therewith and the second metal film 113 remains on the wall and bottom of the second opening 110b. Thereafter, a third insulating film 114 with a thickness of 50 to 300 nm, for example, is formed on the second metal film 113 including the fifth openings 113a and the sixth opening 113b and on the second insulating film 110, and then a second hydrogen barrier film 115 is formed on the third insulating film 114. Accordingly, a region including the portion for drawing the potential of an upper electrode to a second doped layer is completely covered with the hydrogen barrier films, in the same manner described above. This ensures prevention of characteristic deterioration of ferroelectric capacitors caused by hydrogen. Then, a fourth insulating film 116 with a thickness of 100 to 300 nm, for example, is formed on the second hydrogen barrier film 115. Though not shown, general interconnects and others are formed on the fourth insulating film 116.

As described above, with the method for fabricating the semiconductor device of the third modified example, the first metal films 111 underlying the second metal film 113 is present on the wall and bottom of the second opening 110b and the first metal films 111 and the second metal film 113 are tightly in contact with each other. Accordingly, peeling of the second metal film 113 from the second insulating film 110 that might occur when the second metal film 113 is directly formed on the wall and bottom of the second opening 110b is prevented, so that no disconnection occurs. As a result, a material for the second metal film serving as the upper electrode can be freely selected.

FOURTH MODIFIED EXAMPLE

FIGS. 22A and 22B and FIGS. 23A and 23B are cross-sectional views showing respective process steps of a method for fabricating a semiconductor device according to a fourth modified example of the second embodiment. These drawings are cross-sectional views showing respective process steps in the cases of fabricating the semiconductor devices of the first embodiment shown in FIGS. 6 and 7, respectively. In the drawings, components corresponding to those of the semiconductor devices shown in FIGS. 6 and 7 are denoted by the same reference numerals.

Figure 22A:
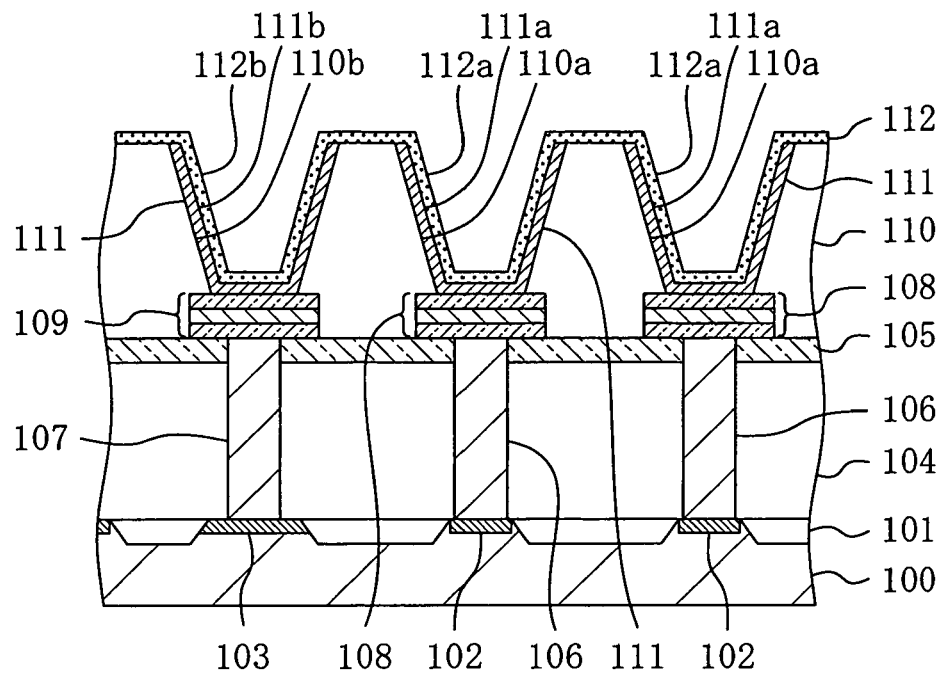
FIGS. 22A and 22B are cross-sectional views showing respective process steps of the method for fabricating a semiconductor device according to a fourth modified example of the second embodiment.

First, process steps up to fabrication of the semiconductor device shown in the cross-sectional view of FIG. 22A are the same as those in the description using FIGS. 18A and 18B, FIGS. 19A and 19B and FIG. 20A, and description thereof is not repeated.

Figure 22B:
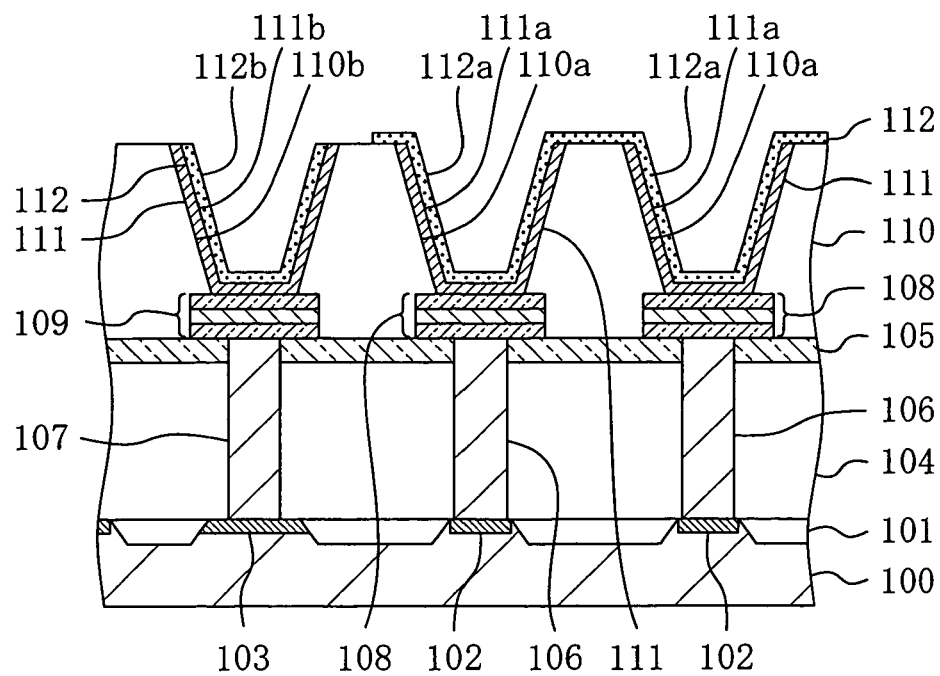

Next, as shown in FIG. 22B, a ferroelectric film 112 is patterned such that cell plates including the ferroelectric film 112 are formed. At this time, part of the ferroelectric film 112 near the edge of a second opening 110b is removed so that part of first metal films 111 located at the end of the wall of the second opening 110b is exposed. The ferroelectric film 112 remains on the wall and bottom of the second opening 110b. In FIG. 22B, the first metal films 111 are exposed at the edge of the second opening 110b. Alternatively, part of the first metal films 111 may be exposed at the bottom of the second opening 110b, for example.

Figure 23A:
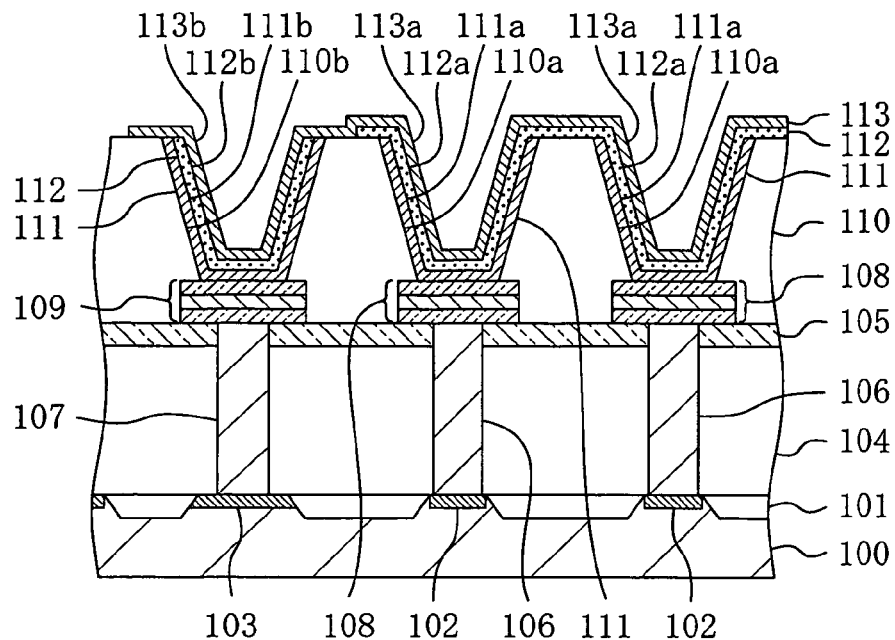
FIGS. 23A and 23B are cross-sectional views showing respective process steps of the method for fabricating a semiconductor device according to the fourth modified example of the second embodiment.

Then, as shown in FIG. 23A, a second metal film 113 made of a noble metal typified by platinum or iridium or a metal oxide containing such a metal and having fifth openings 113a and a sixth opening 113b is formed on part of the ferroelectric film 112 including a ninth opening 112b, on part of the ferroelectric film 112 including the walls and bottoms of fourth openings 112a, and over the entire surface of the second insulating film 110.

Figure 23B:
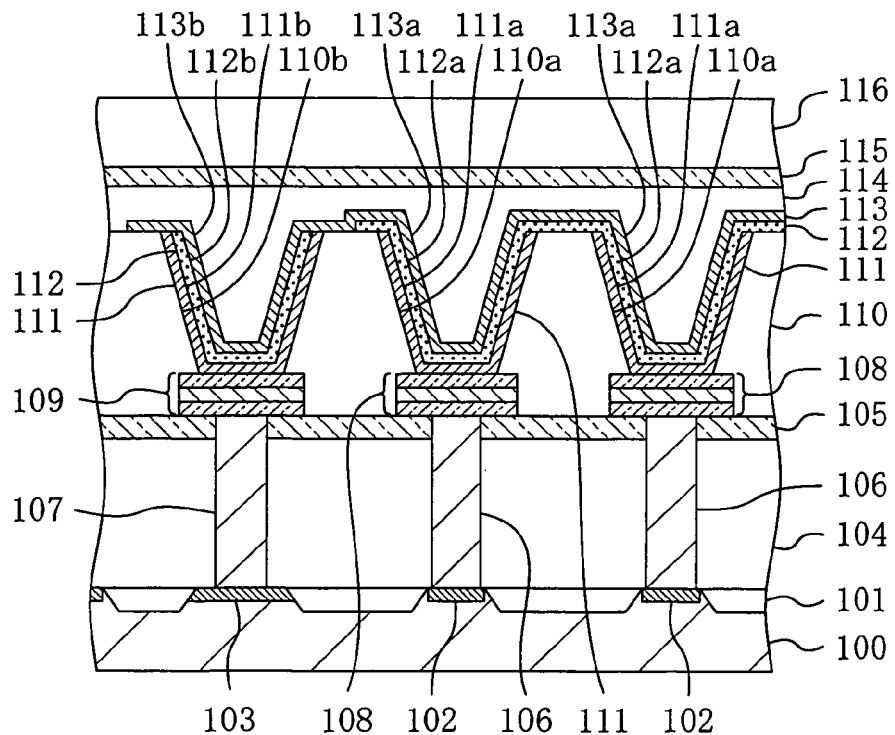
Figure 24:
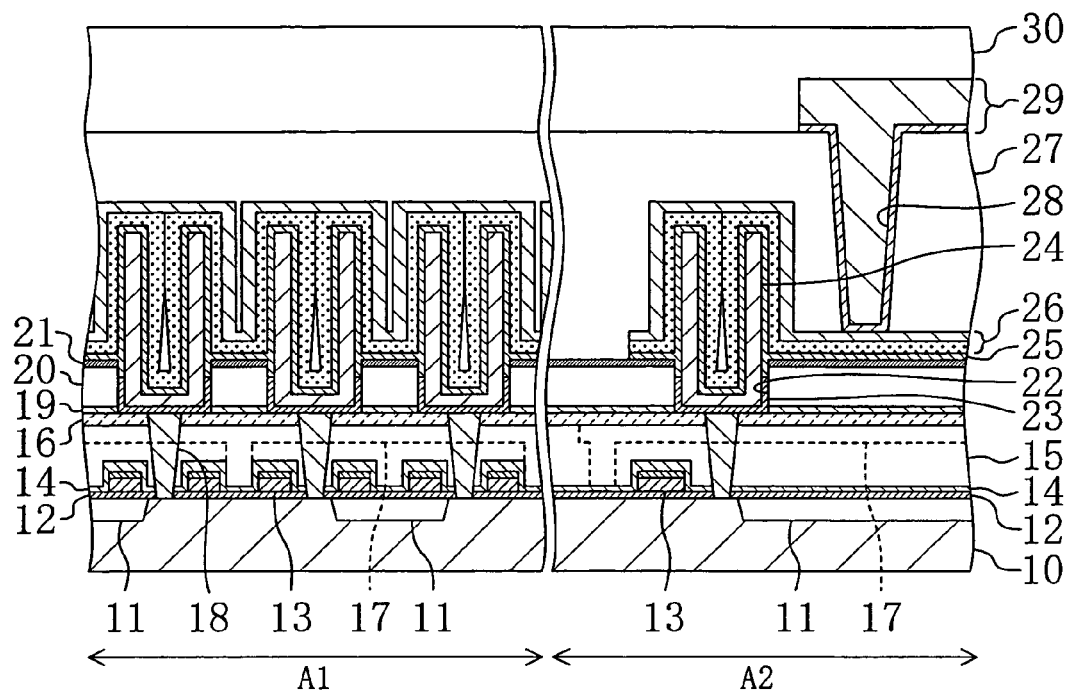
FIG. 24 is a cross-sectional view illustrating a structure of a semiconductor device according to a first conventional example.
Figure 25:
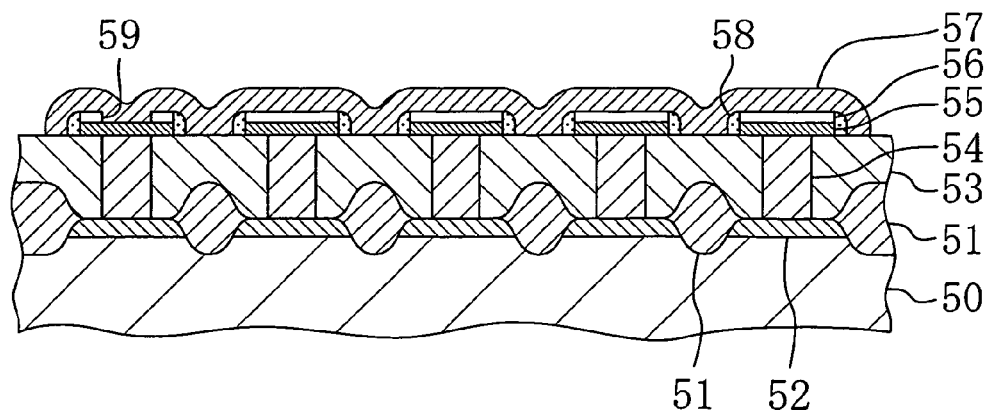
FIG. 25 is a cross-sectional view illustrating a structure of a semiconductor device according to a second conventional example.

Then, as shown in FIG. 23B, the second metal film 113 is patterned using a desired mask such that the ferroelectric film 112 is still covered therewith and parts of the second metal film 113 remains on the wall and bottom of the second opening 110b. Thereafter, a third insulating film 114 with a thickness of 50 to 300 nm, for example, is formed on the second metal film 113 including the fifth openings 113a and the sixth opening 113b and on part of the second insulating film 110. Then, a second hydrogen barrier film 115 is formed on the third insulating film 114. Accordingly, a region including a contact is completely covered with the hydrogen barrier films in the same manner as described above. This ensures prevention of characteristic deterioration of ferroelectric capacitors caused by hydrogen. Subsequently, a fourth insulating film 116 with a thickness of 100 to 300 nm, for example, is formed on the second hydrogen barrier film 115. Though not shown, general interconnects and others are formed on the fourth insulating film 116.

As described above, with the method for fabricating the semiconductor device according to the fourth modified example, the materials stacked in the first openings 110a and the materials stacked in the second opening 110b are the same. Accordingly, the potential of the upper electrode is easily drawn to a second doped layer 110b. In addition, the first metal film 111 and the second metal film 113 are in contact with each other within the second opening 110b, so that miniaturization is achieved, as compared to a case where these films are in contact with each other in a portion of the first metal film 111 extending off the second opening 110b.

The description of the foregoing embodiments is based on the structure in which each of the openings has a tapered shape. However, the present invention is not limited to the shape shown in the drawings.

As described above, the present invention is useful for forming a ferroelectric memory having a three-dimensional stacked structure.

What is claimed is:

1. A semiconductor device, comprising:
   first and second conductive layers spaced and formed in a semiconductor substrate;
   a first insulating film formed on the semiconductor substrate, the first conductive layer and the second conductive layer;
   a first plug formed through the first insulating flim;
   a second plug formed through the first insulating flim;
   a second insulating film formed on the first insulating film and having a first opening above the first plug and a second opening above the second plug;
   a lower electrode made of a first metal film formed on a wall and a bottom of the first opening, having a bend portion at a boundary between the wall and the bottom, and electrically connected to the first plug;
   a capacitive dielectric film made of a ferroelectric film formed on the lower electrode, and
   an upper electrode made of a second metal film formed on the capacitive dielectric film and above the lower electrode,
   wherein the second metal film extends from above the capacitive dielectric film to the second opening and is electrically connected to the second plug in the second opening, and
   an aperture size of the second opening is smaller than an aperture size of the first opening at a same distance from the substrate.

2. The semiconductor device of claim 1, further comprising a second plug formed through the first insulating film and having a lower end connected to the second conductive layer,
   wherein the second insulating film further has a second opening above the second plug,
   the first metal film is also formed on a wall and a bottom of the second opening,
   the second metal film extends from a portion on the capacitive dielectric film to cover the part of the first metal film located on the wall and bottom of the second opening, and
   the second conductive layer and the upper electrode are electrically connected to each other via the second plug, the first metal film electrically connected to the second plug and located on the wall and bottom of the second opening, and the second metal film located on the first metal film.

3. The semiconductor device of claim 1, further comprising a second plug formed through the first insulating film and having a lower end connected to the second conductive layer,
   wherein the second insulating film further has a second opening above the second plug,
   the first metal film is also formed on a wall and a bottom of the second opening,
   the ferroelectric film is also formed on the part of the first metal film located on the wall and bottom of the second opening,
   the second metal film extends from a portion on the capacitive dielectric film to cover the parts of the first metal film and the ferroelectric film located on the wall and bottom of the second opening and is in contact with at least a part of the first metal film, and the second conductive layer and the upper electrode are electrically connected to each other via the second plug, the first metal film electrically connected to the second plug and located on the wall and bottom of the second opening, and the second metal film in contact with the part of the first metal film.

4. The semiconductor device of claim 1, wherein an oxygen barrier film is formed between the first plug and the lower electrode.

5. The semiconductor device of claim 1, wherein the first metal film is made of a metal oxide.

6. The semiconductor device of claim 1, wherein the capacitor is covered with a hydrogen barrier film.

7. The semiconductor device of claim 1, wherein the aperture size of the first opening increases toward the top.

8. The semiconductor device of claim 1, wherein the aperture size of the second opening increases toward the top.

9. The semiconductor device of claim 1, wherein the second metal film is formed so as to come in contact with a wall and a bottom of the second opening.

10. The semiconductor device of claim 1, wherein the upper electrode made of a second metal film is formed above the lower electrode in the same vertical plane.

11. The semiconductor device of claim 1, wherein the second metal film is formed on a wall and a bottom of the second opening, having a bend portion at a boundary between the wall and the bottom.

12. The semiconductor device of claim 1, wherein the second metal film is connected directly to the second plug in the second opening.

* * * * *